(12) United States Patent
Tong

(10) Patent No.: US 7,332,410 B2
(45) Date of Patent: Feb. 19, 2008

(54) METHOD OF EPITAXIAL-LIKE WAFER BONDING AT LOW TEMPERATURE AND BONDED STRUCTURE

(75) Inventor: Qin-Yi Tong, Durham, NC (US)

(73) Assignee: Ziptronix, Inc., Research Triangle Park, NC (US)

( * ) Notice: Subject to any disclaimer, the term of this patent is extended or adjusted under 35 U.S.C. 154(b) by 0 days.

(21) Appl. No.: 10/358,141

(22) Filed: Feb. 5, 2003

(65) Prior Publication Data

US 2003/0141502 A1    Jul. 31, 2003

Related U.S. Application Data

(62) Division of application No. 09/635,272, filed on Aug. 9, 2000, now Pat. No. 6,563,133.

(51) Int. Cl.
*H01L 21/48* (2006.01)
(52) U.S. Cl. .................. 438/455; 438/482; 438/513; 438/514; 257/E21.122
(58) Field of Classification Search .............. 438/455, 438/471, 476–477, 485, 486; 257/E21.122
See application file for complete search history.

(56) References Cited

U.S. PATENT DOCUMENTS

| | | | |
|---|---|---|---|
| 3,423,823 A | 1/1969 | Ansley | |
| 3,488,834 A | 1/1970 | Baird | |
| 3,508,980 A | 4/1970 | Jackson, Jr. et al. | |
| 3,534,467 A | 10/1970 | Sachs et al. | |
| 3,579,391 A | 5/1971 | Buie | |

(Continued)

FOREIGN PATENT DOCUMENTS

EP     0209173 A     1/1987

(Continued)

OTHER PUBLICATIONS

Wolf et al., Silicon Processing for the VLSI Era vol. 1: Process Technology, Lattice Press, 1986, p. 308-311.*

(Continued)

*Primary Examiner*—Kenneth Parker
*Assistant Examiner*—José R. Diaz
(74) *Attorney, Agent, or Firm*—Oblon, Spivak, McClelland, Maier & Neustadt, P.C.

(57) ABSTRACT

A process for bonding oxide-free silicon substrate pairs and other substrates at low temperature. This process involves modifying the surface of the silicon wafers to create defect regions, for example by plasma-treating the surface to be bonded with a or boron-containing plasmas such as a $B_2H_6$ plasma. The surface defect regions may also be created by ion implantation, preferably using boron. The surfaces may also be amorphized. The treated surfaces are placed together, thus forming an attached pair at room temperature in ambient air. The bonding energy reaches approximately 400 $mJ/m^2$ at room temperature, 900 $mJ/m^2$ at 150° C., and 1800 $mJ/m^2$ at 250° C. The bulk silicon fracture energy of 2500 $mJ/m^2$ was achieved after annealing at 350-400° C. The release of hydrogen from B—H complexes and the subsequent absorption of the hydrogen by the plasma induced modified layers on the bonding surfaces at low temperature is most likely responsible for the enhanced bonding energy.

94 Claims, 11 Drawing Sheets

U.S. PATENT DOCUMENTS

| | | | |
|---|---|---|---|
| 3,587,166 A | 6/1971 | Alexander | |
| 3,602,981 A | 9/1971 | Kooi | |
| 3,607,466 A | 9/1971 | Miyazaki | |
| 3,640,807 A | 2/1972 | Van Dijk | |
| 3,647,581 A | 3/1972 | Mash | |
| 3,888,708 A | 6/1975 | Wise et al. | |
| 3,909,332 A * | 9/1975 | Yerman | 438/406 |
| 4,416,054 A | 11/1983 | Thomas et al. | |
| 4,612,083 A | 9/1986 | Yasumoto et al. | |
| 4,617,160 A | 10/1986 | Belanger et al. | |
| 4,649,630 A | 3/1987 | Boland et al. | |
| 4,754,544 A | 7/1988 | Hanak | |
| 4,829,018 A | 5/1989 | Wahlstrom | |
| 4,962,879 A | 10/1990 | Goesele et al. | |
| 4,963,505 A | 10/1990 | Fujii et al. | |
| 4,970,175 A | 11/1990 | Haisma et al. | |
| 4,978,421 A | 12/1990 | Bassous et al. | |
| 4,983,251 A | 1/1991 | Haisma et al. | |
| 5,024,723 A | 6/1991 | Goesele et al. | |
| 5,034,343 A | 7/1991 | Rouse et al. | |
| 5,070,026 A | 12/1991 | Greenwald et al. | |
| 5,071,792 A | 12/1991 | VanVonno et al. | |
| 5,081,061 A | 1/1992 | Rouse et al. | |
| 5,087,585 A | 2/1992 | Hayashi | |
| 5,089,431 A | 2/1992 | Slatter et al. | |
| 5,121,706 A | 6/1992 | Nichols et al. | |
| 5,162,251 A | 11/1992 | Poole et al. | |
| 5,183,783 A | 2/1993 | Ohta et al. | |
| 5,196,375 A | 3/1993 | Hoshi | |
| 5,266,511 A | 11/1993 | Takao | |
| 5,270,227 A * | 12/1993 | Kameyama et al. | 438/234 |
| 5,270,261 A | 12/1993 | Bertin et al. | |
| 5,272,104 A | 12/1993 | Schrantz et al. | |
| 5,321,301 A | 6/1994 | Sato et al. | |
| 5,324,687 A | 6/1994 | Wojnarowski | |
| 5,354,695 A | 10/1994 | Leedy | |
| 5,362,659 A | 11/1994 | Cartagena | |
| 5,376,579 A | 12/1994 | Annamalai | |
| 5,380,681 A | 1/1995 | Hsu | |
| 5,407,856 A | 4/1995 | Quenzer et al. | |
| 5,421,953 A | 6/1995 | Nagakubo et al. | |
| 5,427,638 A | 6/1995 | Goetz et al. | |
| 5,432,729 A | 7/1995 | Carson et al. | |
| 5,441,591 A | 8/1995 | Imthurn et al. | |
| 5,441,911 A | 8/1995 | Malhi | |
| 5,453,394 A * | 9/1995 | Yonehara et al. | 438/455 |
| 5,459,104 A | 10/1995 | Sakai | |
| 5,460,659 A | 10/1995 | Krut | |
| 5,466,303 A * | 11/1995 | Yamaguchi et al. | 148/33 |
| 5,485,540 A | 1/1996 | Eda | |
| 5,489,554 A | 2/1996 | Gates | |
| 5,497,033 A | 3/1996 | Fillion et al. | |
| 5,503,704 A | 4/1996 | Bower et al. | |
| 5,514,235 A | 5/1996 | Mitani et al. | |
| 5,516,727 A | 5/1996 | Broom | |
| 5,517,754 A | 5/1996 | Beilstein, Jr. et al. | |
| 5,534,465 A | 7/1996 | Frye et al. | |
| 5,546,494 A | 8/1996 | Eda | |
| 5,548,178 A | 8/1996 | Eda et al. | |
| 5,561,303 A | 10/1996 | Schrantz et al. | |
| 5,563,084 A | 10/1996 | Ramm et al. | |
| 5,567,657 A | 10/1996 | Wojnarowski et al. | |
| 5,569,620 A | 10/1996 | Linn et al. | |
| 5,580,407 A | 12/1996 | Haisma et al. | |
| 5,591,678 A | 1/1997 | Bendik et al. | |
| 5,603,779 A * | 2/1997 | Linn et al. | 438/455 |
| 5,647,932 A | 7/1997 | Taguchi et al. | |
| 5,650,353 A | 7/1997 | Yoshizawa et al. | |
| 5,652,436 A | 7/1997 | Stoner et al. | |
| 5,653,019 A | 8/1997 | Bernhardt et al. | |
| 5,661,316 A | 8/1997 | Kish, Jr. et al. | |
| 5,661,901 A | 9/1997 | King | |
| 5,666,706 A | 9/1997 | Tomita et al. | |
| 5,668,057 A | 9/1997 | Eda et al. | |
| 5,672,240 A | 9/1997 | Stoner et al. | |
| 5,673,478 A | 10/1997 | Beene et al. | |
| 5,688,714 A * | 11/1997 | Widdershoven et al. | 438/455 |
| 5,698,471 A | 12/1997 | Namba et al. | |
| 5,741,733 A | 4/1998 | Bertagnolli et al. | |
| 5,747,857 A | 5/1998 | Eda et al. | |
| 5,755,914 A | 5/1998 | Yonehara | |
| 5,759,753 A | 6/1998 | Namba et al. | |
| 5,760,478 A | 6/1998 | Bozso et al. | |
| 5,763,318 A | 6/1998 | Bertin et al. | |
| 5,766,984 A | 6/1998 | Ramm et al. | |
| 5,771,555 A | 6/1998 | Eda et al. | |
| 5,783,477 A | 7/1998 | Kish, Jr. et al. | |
| 5,785,874 A | 7/1998 | Eda | |
| 5,793,115 A | 8/1998 | Zavracky et al. | |
| 5,804,086 A | 9/1998 | Bruel | |
| 5,821,665 A | 10/1998 | Onishi et al. | |
| 5,841,197 A | 11/1998 | Adamic, Jr. | |
| 5,849,627 A | 12/1998 | Linn et al. | |
| 5,851,894 A | 12/1998 | Ramm | |
| 5,866,942 A | 2/1999 | Suzuki et al. | |
| 5,869,354 A | 2/1999 | Leedy | |
| 5,872,025 A | 2/1999 | Cronin et al. | |
| 5,877,034 A | 3/1999 | Ramm et al. | |
| 5,877,070 A | 3/1999 | Goesele et al. | |
| 5,877,516 A | 3/1999 | Mermagen et al. | |
| 5,880,010 A | 3/1999 | Davidson | |
| 5,902,118 A | 5/1999 | Hubner | |
| 5,903,018 A | 5/1999 | Shimawaki | |
| 5,904,860 A | 5/1999 | Nagakubo et al. | |
| 5,910,699 A | 6/1999 | Namba et al. | |
| 5,915,167 A | 6/1999 | Leedy | |
| 5,915,193 A | 6/1999 | Tong et al. | |
| 5,920,142 A | 7/1999 | Onishi et al. | |
| 5,936,280 A | 8/1999 | Liu | |
| 5,966,622 A | 10/1999 | Levine et al. | |
| 5,982,010 A | 11/1999 | Namba et al. | |
| 5,990,472 A | 11/1999 | Rinne | |
| 5,991,989 A | 11/1999 | Onishi et al. | |
| 6,004,866 A | 12/1999 | Nakano et al. | |
| 6,018,211 A | 1/2000 | Kanaboshi et al. | |
| 6,048,752 A | 4/2000 | Linderman | |
| 6,071,761 A | 6/2000 | Jacobs | |
| 6,087,760 A | 7/2000 | Yamaguchi et al. | |
| 6,103,009 A | 8/2000 | Atoji | |
| 6,120,917 A | 9/2000 | Eda | |
| 6,133,640 A | 10/2000 | Leedy | |
| 6,143,628 A | 11/2000 | Sato et al. | |
| 6,146,992 A | 11/2000 | Lauterbach et al. | |
| 6,153,445 A | 11/2000 | Yamazaki et al. | |
| 6,153,495 A | 11/2000 | Kub et al. | |
| 6,154,940 A | 12/2000 | Onishi et al. | |
| 6,156,624 A | 12/2000 | Yamagata et al. | |
| 6,159,767 A | 12/2000 | Eichelberger | |
| 6,165,817 A | 12/2000 | Akram et al. | |
| 6,180,496 B1 * | 1/2001 | Farrens et al. | 438/455 |
| 6,190,778 B1 | 2/2001 | Batz-Sohn et al. | |
| 6,197,663 B1 | 3/2001 | Chandross et al. | |
| 6,198,159 B1 | 3/2001 | Hosoma et al. | |
| 6,236,141 B1 | 5/2001 | Sato et al. | |
| 6,246,068 B1 | 6/2001 | Sato et al. | |
| 6,255,731 B1 | 7/2001 | Ohmi et al. | |
| 6,255,899 B1 | 7/2001 | Bertin et al. | |
| 6,270,202 B1 | 8/2001 | Namba et al. | |
| 6,274,892 B1 | 8/2001 | Kub et al. | |
| 6,323,108 B1 | 11/2001 | Kub et al. | |
| 6,448,174 B1 | 9/2002 | Ramm | |
| 6,534,381 B2 * | 3/2003 | Cheung et al. | 438/455 |
| 6,562,647 B2 | 5/2003 | Zandman et al. | |
| 6,902,987 B1 * | 6/2005 | Tong et al. | 438/455 |

| | | | |
|---|---|---|---|
| 2003/0008475 | A1* | 1/2003 | Cheung et al. ............ 438/455 |

FOREIGN PATENT DOCUMENTS

| | | | |
|---|---|---|---|
| EP | 1130647 | A | 9/2001 |
| JP | 54116888 | A | 9/1979 |
| JP | 54155770 | A | 12/1979 |
| JP | 62031138 | A | 2/1987 |
| JP | 63237408 | A | 10/1988 |
| JP | 63246841 | A | 10/1988 |
| JP | 01259546 | A | 10/1989 |
| JP | 02177435 | A | 7/1990 |
| JP | 03070155 | A | 3/1991 |
| JP | 03101128 | A | 4/1991 |
| JP | 60167439 | A | 8/1995 |
| WO | WO 9613060 | A | 5/1996 |
| WO | WO 9845130 | A | 10/1998 |
| WO | WO 0126137 | A | 4/2001 |
| WO | WO 0161743 | A | 8/2001 |

OTHER PUBLICATIONS

Qin-Yi Tong, et al., SemIconductor Wafer Bonding Science and Technology, John Wiley & Sons, Inc., 1999.
Ciarlo, Dino R., Proceedings of the Second International Symposium on Semiconductor Wafter Bonding: Science, Technology, and Applications, Proceedings, vol. 93-29, pp. 313-326, "High and Low-Temperature Bonding Techniques for Microstructures", May 1993.
Ross, R.C., et al., Journal of Non-Crysalltine Solids, vol. 66, pp. 81-86, "Physical Microstructure in Device-Quality Hydrogenated Amorphous Silicon", 1984.
Ko, W.H., et al., Micromachining and Micropackaging of Transducers, pp. 41-61, "Bonding Techniques for Microsensors,", 1985.
G.L.Sun, et al., Journal de Physique, vol. 49, No. 9, pp. C4-79—C4-82, "Cool Plasma Activated Surface in Silicon Wafer Direct Bonding Technology," Sep. 1988.
Q. Y. Tong, et al., Appl. Phys. Lett., vol. 64, No. 5, pp. 625-627, "Hydrophobic Silicon Wafer Bonding", Jan. 31, 1994.
U. Goesele, et al., Appl. Phys. Lett, vol. 67, No. 24, pp. 3614-3616, "Self-Propagating Room-Temperature Silicon Wafer Bonding in Ultrahigh Vacuum", Dec. 11, 1995.
H. Takagi, et al., Appl. Phys. Lett. vol. 68, No. 16, pp. 2222-2224, "Surface Activated Bonding of Silicon Wafers at Room Temperature", Apr. 15, 1996.
K. D. Hobart, et al., Applied Physics Letters, vol. 72, No. 9, pp. 1095-1097, "Characterization of Si pn Junctions Fabricated by Direct Wafer Bonding in Ultra-High Vacuum", Mar. 2, 1998.
T. Akatsu, et al., Journal of Applied Physics, vol. 86, No. 12, pp. 7146-7150, "GaAs Wafer Bonding by Atomic Hydrogen Surface Cleaning", Dec. 15, 1999.
H. Kim, et al., Appl. Phys. Lett., vol. 69, No. 25, pp. 3869-3871, Effects of B Doping on Hydrogen Desorption from Si(001) During Gas-Source Molecular-Beam Epitaxy from $Si_2H_6$ and $B_2H_6$ Dec. 16, 1996.
G. Hess, et al., Appl. Phys. Lett., vol. 71, No. 15, pp. 2184-2188, "Evolution of Subsurface Hydrogen from Boron-Doped Si(100)", Oct. 13, 1997.
F. J. Kub, et al., The 1999 Joint International Meeting, vol. 99-2, Abstract No. 1031, 2 pages, "A Double-Side IGBT by Low Temperature Wafer Bonding", Oct. 17-22, 1999.
A. Ploessl, et al., Mat. Res. Soc. Symp. Proc., vol. 483, pp. 141-146, "Covalent Silicon Bonding at Room Temperature in Ultrahigh vacuum", 1998.
S. N. Farrens, et al., J. Electrochem. Soc., vol. 142, No. 11, pp. 3949-3955, "Chemical Free Room Temperature Wafer to Wafer Direct Bonding", Nov. 1995.
H. Nakanishi, et al., Proc. the 11th Ann. Intl. Workshop on MicroElectroMechanical System, IEEE CH36176, pp. 609-614, "Studies on SiO2-SiO2 Bonding with Hydrofluoric Acid—Room Temperature and Low Stress Bonding Technique for MEMS", 1998.
P. Amirfeiz, et al., The 1999 Joint International Meeting, vol. 99-2, Abstract 963, 2 pages, "Formation of Silicon Structures by Plasma Activated Wafer Bonding", Oct. 17-22, 1999.
S. Bengtsson, et al., International Conference on Compliant & Alternative Substrate Technology, p. 10, "Low Temperature Wafer Bonding", Sep. 1999.
S. Farrens, Electrochemical Society Proceedings, vol. 97-36, pp. 425-436, "Low Temperature Wafer Bonding", 1997.
B. E. Roberds, et al., Electromechanical Society Proceedings, vol. 97-36, pp. 598-606, "Low Temperature, in Situ, Plasma Activated Wafer Bonding", 1997.
B. E. Roberds, et al., Electromechanical Society Proceedings, vol. 97-36, pp. 592-597, "Wafer Bonding of GaAs, InP, and Si Annealed Without Hydrogen for Advanced Device Technologies", 1997.
S. Fujino, et al., Jpn. J. Appl. Phys., vol. 34, Part 2, No. 10B, 1 Page, "Silicon Wafer Direct Bonding Through the Amorphous Layer", Oct. 15, 1998 (Abstract Only).
L. Rayleigh, Proceedings of the Royal Society of London, Series A—Mathematical and Physical Sciences, vol. 156, pp. 326-349, "A Study of Glass Surfaces in Optical Contact", Sep. 1, 1936.
M.K. Weldon, et al., Proceedings of the Fourth International Symposium on Semiconductor Wafer Bonding: Science, Technology, and Application, Proceedings vol. 97-36, pp. 229-248, "Mechanistic Studies of Silicon Wafer Bonding and Layer Exfoliation", (no date).
S. Schulze, et al., Proceedings of the Second International Symposium on Microstructures and Microfabricated Systems, Proceedings vol. 95-27, pp. 309-318, "Investigation of Bonded Silicon-Silicon-Interfaces Using Scanning Acoustic Microscopy", (no date).
Q.-Y. Tong, et al., 1999 IEEE International SOI Conference, pp. 104-105, "IOS—A New Type of Materials Combination for System-on-a Chip Preparation," Oct. 1999.
Yozo Kanda, et al., Sensors and Actuators, vol. A21-A23, pp. 939-943, "The Mechanism of Field-Assisted Silicon-Glass Bonding", 1990.
Jiwei Jiao, et al., Sensors and Actuators, vol. A50, pp. 117-120, "Low-Temperature Silicon Direct Bonding and Interface Behaviours", 1995.
A. Berthold, et al., Sensors and Actuators, vol. A68, pp. 410-413, "Wafer-to-Wafer Fusion Bonding of Oxidized Silicon to Silicon at Low Temperatures", 1998.
Q.-Y. Tong, et al., Electrochemical and Solid-State Letters, vol. 1, No. 1, pp. 52-53, "Low Vacuum Wafer Bonding", 1998.
Gudrun Kissinger, et al., Sensors and Actuators, vol. A36, pp. 149-156, "Void-Free Silicon-Wafer-Bond Strengthening in the 200-400°C Range", 1993.
B.M. Arora, et al., J. Vac. Sci. Technol. vol. B5, No. 4, pp. 876-882, "Reactive Ion-Etching-Induced Damage in Silicon Using SF, Gas Mixtures", Jul./Aug. 1987.
Leslie A. Field, et al., Sensors and Actuators, vol. A21-A23, pp. 935-938, "Fusing Silicon Wafers with Low Melting Temperature Glass", 1990.
Stefan Bengtsson, et al., Journal of Electronic Materials, vol. 29, No. 7, "Room Temperature Wafer Bonding of Silicon Oxidized Silicon, and Crystalline Quartz", 2000.
P. Amirfeiz, et al., Journal of the Electrochemical Society, vol. 147, No. 7, pp. 2693-2698, "Formation of Silicon Structures by Plasma-Activated Wafer Bonding", 2000.
Donato Pasquariello, et al., Journal of the Electrochemical Society, vol. 147, No. 7, pp. 2699-2703, "Oxidation and Induced Damage in Oxygen Plasma in Situ Wafer Bonding", 2000.
Donato Pasquariello, et al., Journal of the Electrochemical Society, vol. 147, No. 6, pp. 2343-2346, "Mesa-Spacers: Enabling Nondestructive Measurement of Surface Energy in Room Temperature Wafer Bonding", 2000.
M. Petzold, et al., Proceedings of the Third International Symposium on Semiconductor Wafer Bonding: Physics and Applications, Proceedings vol. 95-7, pp. 380-389, "Interface Strength Characterization of Bonded Wafers", (no date).
J. Bagdahn, et al., Proceedings of the Fourth International Symposium on Semiconductor Wafer Bonding: Science, Technology, and Applications, Proceedings vol. 97-36, pp. 291-298, "Characterisation of Directly Bonded Silicon Wafers by Means of the Double Cantilever Crack Opening Method", (no date).
A PLOβL, e al., Materials Science & Engineering, vol. R25, Nos. 1-2, pp. 1-88, "Wafer Direct Bonding: Tailoring Adhesion Between Brittle Materials", Mar. 10, 1999.

Tadahiro Ohmi, et al., Proceedings Fifth International IEEE VLSI Multilevel Interconnection Conference, pp. 261- 267, "VLSI Interconnects for Ultra High Speed Signal Propagation", Jun. 13-14, 1988.

William Liu, et al., IEEE Transactions on Electron Devices, vol. 40, No. 11, pp. 1917-1927, "Current Gain Collapse in Mircowave Multifinger Heterojunction Bipolar Transistors Operated at very High Power Densities", Nov. 1993.

Darrell Hill, et al., IEEE Microwave and Guided Wave Letters, vol. 5, No. 11, pp. 373-375, "Novel HBT With Reduced Thermal Impedance", Nov. 1995.

J.F. Jensen, et al., IEEE Journal of Solid-Stated Circuits, vol. 30, No. 10, pp. 1119-1127, "A 3.2-GHz Second-Order Delta-Sigma Modulator Implemented in InP HBT Technology", Oct. 1995.

Burhan Bayraktaroglu, et al., IEEE Electron Device Letters, vol. 14, No. 10, pp. 493-495, "Very High-Power-Density CW Operation of GaAs/AlGaAs Microwave HeteroJunction Bipolar Transistors", Oct. 1993.

Alex Q. Huang, IEEE Transactions on Electron Devices, vol. 43, No. 6, pp. 1029-1032, "Analysis of the Inductive Turn-Off of Double Gate MOS Controlled Thyristors", Jun. 1996.

Peter J. Wright, et al., IEEE Transactions on Electron Devices, vol. 36, No. 5, pp. 879-889, "The Effect of Fluorine in Silicon Dioxide Gate Dielectrics", May 1989.

D. Gráf, et al., J. Vac. Sci. Technol., A7(3), pp. 808-813, "Reaction of Water With Hydrofluoric Acid Treated Silicon (111) and (100) Surfaces", May/Jun. 1989.

Q-Y. Tong, et al., Mrs Bulletin, pp. 40-44, "Beyond "Smart-Cut®": Recent Advances in Layer Transfer for Material Integration", Dec. 1998.

Jan Haisma, Philips Journal of Research, vol. 49, No. 1/2, pp. 165-170, "Direct Bonding in Patent Literature", 1995.

G.A.C.M. Spierings, et al., Philips Journal of Research, vol. 49, No. 1/2, pp. 47-63, "Surface-Related Phenomena in the Direct Bonding of Silicon and Fused-Silica Wafer Pairs", 1995.

Peter P. Gillis, et al., Journal of Applied Physics, vol. 35, No. 3 (Part I), pp. 647-658, "Double-Cantilever Cleavage Mode of Crack Propagation", Mar. 1964.

A. Kazor, et al., Appl. Phys. Lett., vol. 65, No. 12, pp. 1572-1574, "Fluorine Enhanced Oxidation of Silicon at Low Temperatures", Sep. 19, 1994.

R. Williams, et al., Journal of Applied Physics, vol. 46, No. 2, pp. 695-698, "Mobile Fluoride Ions in $SiO_2$ ", Feb. 1975.

S.R. Kasi, et al., Appl. Phys. Lett., vol. 58, No. 25, pp. 2975-2977, "Chemistry of Fluorine in the Oxidation of Silicon", Jun. 24, 1991.

Rochdi Messoussi, et al., Jpn. J. Appl. Phys., vol. 35, Part 1, No. 4A, pp. 1989-1992, "Improvement of Rinsing Efficiency After Sulfuric Acid Hydrogen Peroxide Mixture ($H_2SO_4/H_2O_2$)By HF Addition", 1996.

Ritsuo Takizawa, et al., Jpn. J. Appl. Phys., vol. 27, No. 11, pp. L2210-L2212, "Ultraclean Technique for Silicon Wafer Surfaces with $HNO_3$-HF Systems", Nov. 1998.

R. Stengl, et al., Jpn. J. Appl. Phys., vol. 29, No. 12, pp. L2311-L2314, "Bubble-Free Silicon Wafer Bonding in a Non-Cleanroom Environment", Dec. 1988.

Takao Abe, et al., Jpn. J. Appl. Phys., vol. 29, No. 12, pp. L2311-L2314, "Silicon Wafer Bonding Mechanism for Silicon-On-Insulator Structures", Dec. 1990.

W.K. Chu, et al., Physical Review B, vol. 16, No. 9, pp. 3851-3859, "Distribution of Irradiation Damage in Silicon Bombarded with Hydrogen", Nov. 1, 1977.

Yasushiro Nishioka, et al., Appl. Phys. Lett., vol. 54, No. 12, pp. 1127-1129, "Dielectric Characteristics of Fluorinated Ultradry $SiO_2$ ", Mar. 20, 1999.

D. Kouvatsos, et al., Appl. Phys. Lett., vol. 61, No. 7, pp. 780-782, "Silicon-Fluorine Bonding and Fluorine Profiling in $SiO_2$ Films Grown by $NF_3$-Enhanced Oxidation", Aug. 17, 1992.

T. Höchbauer, et al., Appl. Phys. Lett., vol. 75, No. 25, pp. 3938-3940, "Hydrogen Blister Depth in Boron and Hydrogen Coimplanted N-Type Silicon", Dec. 20, 1999.

Q.-Y. Tong, et al., Appl. Phys. Lett., vol. 70, No. 11, pp. 1390-1392, "Layer Splitting Process in Hydrogen-Implanted Si, Ge, SiC, and Diamond Substrates", Mar. 17, 1997.

Hideki Takagi, et al., Appl. Phys. Lett., vol. 74, No. 16, pp. 2387-2389, "Room-Temperature Bonding of Lithium Niobate and Silicon Wafers by Argon-Beam Surface Activation", Apr. 19, 1999.

M. Morita, et al., Appl. Phys. Lett., vol. 45, No. 12, pp. 1312-1314, "Fluorine-Enhanced Thermal Oxidation of Silicon in the Presence of $NF_3$,", Dec. 15, 1984.

Karin Ljungberg, et al., Appl. Phys. Lett., vol. 62, No. 12, pp. 1362-1364, "Spontaneous Bonding of Hydrophobic Silicon Surfaces", Mar. 22, 1993.

Bernard S. Meyerson, et al., Appl. Phys. Lett., vol. 57, No. 10, pp. 1034-1036, "Bistable Conditions for Low-Temperature Silicon Epitaxy", Sep. 3, 1990.

Q.-Y. Tong, et al., Appl. Phys. Lett., vol. 72, No. 1, pp. 49-51, "A "Smarter-Cut" Approach to Low Temperature Silicon Layer Transfer", Jan. 5, 1998.

A. von Keudell, et al., Appl. Phys. Lett., vol. 71, No. 26, pp. 3832-3834, "Evidence for Atomic H Insertion into Strained Si-Si Bonds in the Amorphous Hydrogenated Silicon Subsurface from in Situ Infrared Spectroscopy", Dec. 29, 1997.

John S. Judge, J. Electrochem. Soc.: Solid State Science, vol. 118, No. 11, pp. 1772-1775, "A Study of the Dissolution of $SiO_2$ in Acidic Fluoride Solutions", Nov. 1971.

Q.-Y. Tong, et al., J. Electrochem. Soc., vol. 143, No. 5, pp. 1773-1779, "A Model of Low-Temperature Wafer Bonding and its Applications", May 1996.

S. Mack, et al., J. Electrochem. Soc., vol. 144, No. 3, pp. 1106-1111, "Analysis of Bonding-Related Gas Enclosure in Micromachined Cavities Sealed by Silicon Wafer Bonding", Mar. 1997.

B. Aspar, et al., Microelectronic Engineering, vol. 36, pp. 233-240, "Basic Mechanism Involved in the Smart-Cut® Process", 1997.

Y. Albert Li, et al., Jpn. J. Appl. Phys., vol. 39, pp. 275-276, "Surface Roughness of Hydrogen Ion Cut Low Temperature Bonded Thin Film Layers", Jan. 2000.

Karin Ljungerg, et al., Electrochemical Society Proceedings, vol. 95-7, pp. 163-173, "Modification of Silicon Surfaces with $H_2SO_4:H_2O_2$: HF and $HNO_3$HF for Wafer Bonding Applications", (no date).

Terry A. Michalske, et al., J. Am. Ceram. Soc., vol. 68, No. 11, pp. 586-590, "Closure and Repropagation of Healed Cracks in Silicate Glass", 1985.

P.J.H. Denteneer, et al., Physical Review B, vol. 39, No. 15, pp. 10809-10824, "Microscopic Structure of the Hydrogen-Boron Complex in Crystalline Silicon", May 15, 1989.

P. Gupta, et al., Physical Review B. vol. 37, No. 14, pp. 8234-8243, "Hydrogen Desorption Kinetics from Monohydride and Dihydride Species on Silicon Surfaces", May 15, 1988.

K. Bergman, et al., Physical Review B, vol. 37, No. 5, pp. 2770-2773, "Donor-Hydrogen Complexes in Passivated Silicon", Feb. 15, 1988.

A.H. Mahan, et al., Physical Review B., vol. 40, No. 17, pp. 12024-12027, "Characterization of Microvoids in Device-Quality Hydrogenated Amorphous Silicon by Small-Angle X-Ray Scatterin and Infrared Measurements", Dec. 15, 1989.

M. Niwano, et al., J. Appl. Phys., vol. 71, No. 11, pp. 5646-5649, "Morphology of Hydrofluoric Acid and Ammonium Fluoride-Treated Silicon Surfaces Studied by Surface Infrared Spectroscopy", Jun. 1, 1992.

Jeffrey T. Borenstein, et al., J. Appl. Phys., vol. 73, No. 6, pp. 2751-2754, "Kinetic Model for Hydrogen Reactions in Boron-Doped Silicon", Mar. 15, 1993.

L. Lusson, et al., J. Appl. Phys., vol. 81, No. 7, pp. 3073-3080, "Hydrogen Configurations and Stability in Amorphous Sputtered Silicon", Apr. 1, 1997.

S.J. Pearton, et al., Appl. Phys. A, vol. 43, pp. 153-195, "Hydrogen In Crystalline Semiconductors", 1987.

S.A. McQuaid, et al., J. Appl. Phys., vol. 81, No. 11, pp. 7612-7618, "Passivation, Structural Modification, and Etching of Amorphous Silicon in Hydrogen Plasmas", Jun. 1, 1997.

U. Bhattacharya, et al., IEEE Electron Device Letters, vol. 16, No. 8, pp. 357-359, "Transferred Substrate Schottky-Collector Heterojunction Bipolar Transistors: First Results and Scaling Laws for High fmax", Aug. 1995.

B. Agarwal, et al., IEEE Electron Device Letters, vol. 18, No. 5, pp. 228-231, "A 277-GHz fmax Transferred-Substrate Heterojunction Bipolar Transistor", May 1997.

Q. Lee, et al., IEEE Electron Device Letters, vol. 19, No. 3, pp. 77-79, "A >400 GHz fmax Transferred-Substrate Heterojunction Bipolar Transistor IC Technology", Mar. 1998.

Q. Lee, et al., IEEE Electron Device Letters, vol. 20, No. 8, pp. 396-398, "Submicron Transferred-Substrate Heterojunction Bipolar Transistors", Aug. 1999.

Kiyoshi Mitani, et al., Jpn. J. Appl. Phys., vol. 31, Part 1, No. 4, pp. 969-974, "A New Evaluation Method of Silicon Wafer Bonding Interfaces and Bonding Strength by Koh Etching", Apr. 1992.

Kiyoshi Mitani, et al, Jpn. J. Appl. Phys., vol. 30, No. 4, pp. 615-622, "Causes and Prevention of Temperature-Dependent Bubbles in Silicon Wafer Bonding", Apr. 1991.

R, Stengl, et al., Jpn. J. Appl. Phys., vol. 28, No. 10, pp. 1735-1741, "A Model for the Silicon Wafer Bonding Process", Oct. 1989.

Hyeokjae Lee, et al., IEDM Technical Digest, vol. 95-683, pp. 28.2.1-28.2.4, "A New Leakage Component Caused by the Interaction of Residual Stress and the Relative Position of Poly-Si Gate at Isolation Edge", Dec. 10-13, 1995.

G.A.C.M. Spierings, et al., Proceedings of the First International Symposium on Semiconductor Wafer Bonding: Science, Technology, and Applications, Proceedings vol. 92-7, pp. 18-32, "Diversity and Interfacial Phenomena in Direct Bonding", (no date).

Shoji Yamahata, et al., IEEE Gallium Arsenide Integrated Circuit Symposium, Technical Digest 1995, pp. 163-166, "Over-220-GHz-$f_t$-and-$f_{max}$ InP/InGaAs Double-HeteroJunction Bipolar Transistors with a new Hexagonal-Shaped Emitter", Oct. 29-Nov. 1, 1995.

W.E. Stanchina, et al, IEEE Gallium Arsenide Integrated Circuit Symposium, Technical Digest 1995, pp. 31-34, "An InP-Based HBT Fab for High-Speed Digital, Analog, Mixed-Signal, and Optoelectronic Ics", Oct. 29-Nov. 1, 1995.

S. Nakamura, et al., IEDM Technical Digest, vol. 95, pp. 889-892, "Giga-Bit Dram Cells with Low Capacitance and Low Resistance Bit-Lines on Buries Mosfets and Capacitors by Using Bonded Soi Technology-Reversed-Stacked-Capacitor (RSTC) Cell-", Dec. 10-13, 1995.

J.B. Lasky, et al., IEDM Technical Digest, vol. 85, pp. 684-687, "Silicon-On-Insulator (SOI) by Bonding and Etch-Back", Dec. 1-4, 1985.

C. den Besten, et al., IEEE Micro Electro Mechanical Systems, pp. 104-109, "Polymer Bonding of Micro-Machined Silicon Structures", Feb. 4-7, 1992.

Farzad Pourahmadi, et al., IEEE Solid-State Sensor and Actuator Workshop: Technical Digest, pp. 144-147, "Variable-Flow Micro-Valve Structure Fabricated with Silicon Fusion Bonding", Jun. 4-7, 1990.

Peter Bjeletich, et al., Proceedings of the Fourth International Symposium on Semiconductor Wafer Bonding: Science, Technology, and Applications, Proceedings vol. 97-36, pp. 349-357, "Electrical Characterization of Plasma Bonded Soi", (no date).

R. Dekker, et al., IEDM Technical Digest, vol. 97, pp. 921-923, "An Ultra Low-Power RF Bipolar Technology on Glass", Dec. 7-10, 1997.

Takeshi Sunada, et al., Jpn. J. Appl. Phys. vol. 29, No. 12, pp. L2408-L2410, "The Role of Fluorine Termination in the Chemical Stability of HF-Treated Si Surfaces", Dec. 1990.

M. Yoshimaru, et al., J. Vac. Sci. Technol. A, vol. 15, No. 6, pp. 2915-2922, "Interaction Between Water and Fluorine-Doped Silicon Oxide Films Deposited by Plasma-Enhanced Chemical Vapor Deposition", Noc./Dec. 1997.

T.M. Duncan, et al., J. Appl. Phys., vol. 60, No. 1, pp. 130-136, "Study of Fluorine in Silicate Glass with $^{19}$F Nuclear Magnetic Resonance Spectroscopy", Jul. 1, 1986.

Eliezer M. Rabinovich, et al., J. Am. Ceram. Soc., vol. 72, No. 7, pp. 1229-1232, "Retention of Fluorine in Silica Gels and Glass", 1989.

Henry Nielsen, et al., J. Electrochem. Soc.: Solid-State Science and Technology, vol. 130, No. 3, pp. 708-711, "Some Illumination on the Mechanism of $SiO_2$ Etching in HF Solutions", Mar. 1983.

Q.-Y. Tong, et al., Electronics Letters, vol. 35, No. 4, pp. 341-342, "Low Temperature InP Layer Transfer", Feb. 18, 1999.

Q.-Y. Tong, et al., Materials Chemistry and Physics, vol. 37, pp. 101-127, "Semiconductor Wafer Bonding: Recent Developments", 1994.

W.P. Maszara, et al., J. Appl. Phys., vol. 64, No. 10, pp. 4943-4950, "Bonding of Silicon Wafers for Silicon-on-Insulator", Nov. 15, 1988.

M. Bruel, Electronics Letters, vol. 31, No. 14, pp. 1201-1202, "Silicon on Insulator Material Technology", Jul. 6, 1995.

No Author, Electronics Letters, vol. 14, No. 18, pp. 593-594, "C.M.O.S. Devices Fabricated on Buried $Sio_2$ Layers Formed by Oxygen Implantation Into Silicon", Aug. 31, 1978.

N.Q. Khánh, et al., J. Electrochem. Soc., vol. 142, No. 7, pp. 2425-2429, "Nondestructive Detection of Microvoids at the Interface of Direct Bonded Silicon Wafers by Scanning Infrared Microscopy", Jul. 1995.

Q.-Y. Tong, et al., Adv. Mater., vol. 11, No. 17, pp. 1409-1425, "Wafer Bonding and Layer Splitting for Microsystems", 1999.

W.P. Maszara, J. Electrochem. Soc., vol. 138, No. 1, pp. 341-347, "Silicon-on-Insulator by Wafer Bonding: A Review", Jan. 1991.

M. Grundner, et al., Appl. Phys. A, vol. 39, pp. 73-82, "Investigations on Hydrophilic and Hydrophobic Silicon (100) Wafer Surfaces by X-Ray Photoelectron and High-Resolution Electron Energy Loss-Spectroscopy", 1986.

Wen Hsiung Ko, et al., IEEE Transactions on Electron Devices, vol. ED-26, No. 12, pp. 1896-1905, "Development of a Miniature Pressure Transducer for Biomedical Applications", Dec. 1979.

George P. Imthum, et al., J. Appl. Phys., vol. 72, No. 6, pp. 2526-2527, "Bonded Silicon-on-Sapphire Wafers and Devices", Sep. 15, 1992.

M. Shimbo, et al., J. Appl. Phys., vol. 60, No. 8, pp. 2987-2989, "Silicon-to-Silicon Direct Bonding Method", Oct. 15, 1986.

J.B. Lasky, Appl. Phys. Lett., vol. 48, No. 1, "Wafer Bonding for Silicon-on-Insulator Technologies", Jan. 6, 1986.

Auberton-Herve'et al., Proceedings of the Eighth International Symposium on Silicon Materials Science and Technoogy, Silicon Materials Science and Technology, vol. 2, Electrochemical Society Proceedings, vol. 98-1, pp. 1341-1360, "Silicon on Insulator Wafers Using The Smart Cut ® Technology", 1998.

Mitani, Kiyoshi, Wafer Bonding: Studies of Interface Bubbles and Electrial Characterization, Department of Electrical Engineering, Duke University, 1991.

"Fabrication of Planar Arrays of Semiconductor Chips Separated by Insulting Barriers", IBM Technical Disclosure Bulletin, Apr. 1965, p. 1103.

"Generalized Reactive Bonding"; Goetz; Proceedings of the 1st Semiconductor Wafer Bonding Symposium, pp. 65-73, 1991.

"Application of Oxygen Plasma Processing to Silicon Direct Bonding"; Zucker et al.; Sensors and Actuators A, 36; pp. 227-231, 1993.

"Room Temperature Silicon and SiO2 Bonding in Ambient"; Qin-Yi Tong; 9 pages; Dec. 10, 1999.

"Direct Bonding in Patent Literature"; Jan Haisma; Philips Journal of Research, vol. 49, No. 1/2, pp. 165-170; 1995.

"Metal Oxide Silicon Circuits on Silicon Membrane"; (no author); IBM Techincal Disclosure Bulletin; p. 2079; Oct. 1979.

"SiN Membrane Masks for X-Ray Lithography"; Suzuki et al.; Journal of Vacuum Science and Technology; vol. 20, No. 2; pp. 191-194; Feb. 1982.

"Evaluation of Polycrystalline Silicon Membranes on Fused Silica for X-Ray Lithography Masks"; Trimble et al.; Journal of Vacuum Science and Technology B (Microelectronics Processing Phenomena); vol. 7, No. 6, pp. 1675-1679; Nov./Dec. 1989.

"Low Stress Tungsten Absorber for X-Ray Masks"; Ku et al.; Microelectronics Engineering, vol. 11, No. 1-4, pp. 303-308; Apr. 1990.

"Deliberate Design for Assuring Adequate Thermal Oxide Sidewall at the Corners of Trenches"; (no author); IBM Technical Disclosure Bulletin; pp. 261-262; Jul. 1991.

"Wafer Bonding with Stress-Free Trench Isolation"; (no author); IBM Technical Disclosure Bulletin; pp. 304-305; Jul. 1991.

"Low Temperture Wafer Direct Bonding", Journal of Microelectromechanical Systems, vol. 3, No. 1, Mar. 1994, pp. 29-35.

"Semiconductor Wafer Bonding, A flexible Approach to Materials Combinations in Microelectronics, Micromechanics and Optoelectronics", 1997 IEEE, pp. 23-32.

"Low Temperature Wafer Bonding of Silicon and Silicon Dioxide by the Surface Activation Method", Transducers 1997, 1997 Int. Conf. on Solid State Sensors and Actuators Jun. 16-19, 1997, pp. 657-660.

"Studies of SiO2-SiO2 Bonding with Hydrofluoric Acid—Room Temperature and Low Stress Bonding Technique for Mems", 1998 IEEE, pp. 609-614.

* cited by examiner

METHOD OF EPITAXIAL-LIKE WAFER BONDING AT LOW TEMPERATURE AND BONDED STRUCTURE

BACKGROUND OF THE INVENTION

1. Field of the Invention

The present invention relates to a method of epitaxial-like bonding of wafer pairs at low temperature, and more particularly to a method of bonding in which the wafer surfaces are modified to create surface and subsurface defect areas, and possibly amorphized, by ion implantation or plasma, preferably by boron-containing ions or a plasma such as $B_2H_6$.

2. Discussion of the Background

For many optoelectronic and electronic device applications, homo-epitaxial single crystalline layers consisting of same material with same crystalline orientation but different doping types or levels are necessary. For some device applications, active layers comprising single crystalline dissimilar materials are required. The active layers should be high crystallographic quality with interfaces that are thermally conductive and almost optical loss free. Conventional hetero-epitaxial growth techniques applied to these lattice mismatched active layers usually result in a large density of threading dislocations in the bulk of the layers. Bonding of single crystalline wafers of identical or dissimilar materials is an unique alternative approach to the epitaxial growth. Not only highly lattice-mismatched wafers can be bonded but also wafers with different crystalline orientations can be combined. Ideally, the mismatches of single crystalline bonding wafers are accommodated by dislocations (in lattice-mismatch case) or an amorphous layer (in orientation-mismatch case) localized at the bonding interface with no defects generated in the bulk area. This approach is termed epitaxial-like bonding. The epitaxial-like bonding can also be employed to prepare unique devices by integrating already processed device layers.

However, conventional epitaxial-like bonding is achieved by high temperature annealing. To bond wafers composed of thermally mismatched materials, severe and often damaging thermal stresses can be induced with high temperature annealing. Since thermal stresses can increase significantly with the size of dissimilar wafers, only small wafers currently can be epitaxially bonded at high temperatures. The high temperature annealing process can also produce unwanted changes to bonding materials and often prevents the bonding of processed device wafers. The bonding materials may decompose at high temperatures, even if the bonding wafers are thermally matched.

In order to epitaxially bond large wafers of dissimilar materials or processed wafers, an epitaxial-like bonding interface must be achieved at or near room temperature, or one wafer of the bonded pair must be thinned sufficiently before annealing to elevated temperatures. Although Goesele et al. in Applied Physics Letters 67, 3614 (1995) and Takagi et al in Applied Physics Letters 74, 2387, 1999 reported room temperature epitaxial-like bonding of silicon wafers in ultrahigh vacuum, high temperature (>600° C.) pre-annealing in the former case or high external pressure (>1 MPa) in the latter case were required to achieve the bond that may introduce undesired effects to the bonding wafers.

Recently, M. Bruel in Electronics Letters 31, 1201 (1995) reported a promising generic thinning approach using a hydrogen-induced layer transfer method (so-called smart-cut method). In this approach, H atoms are implanted into a Si wafer to such concentration that a significant fraction of Si—Si bonds are broken creating a buried H-rich layer of micro-cracks susceptible to cleavage or fracture. By bonding the topmost oxide covered hydrophilic Si wafer surface to another substrate, a thin layer of the Si wafer can then be transferred by fracture of the H-rich region. However, this process requires that the bonding energy between the bonded wafers be higher than the fracture energy of the hydrogen-induced crack region at the layer transfer temperature. The layer transfer temperatures must be lower than the temperature beyond which hydrogen molecules in the material become mobile. For silicon, the temperature is about 500° C. (see Chu et al in Physics Review B, 16, 3851 (1987)). The bonding energy of conventional HF dipped hydrophobic silicon wafer pairs is higher than the hydrogen-induced region only after annealing at temperatures higher than 600° C. Therefore, this process does not work for oxide-free hydrophobic silicon wafer bonding.

Typically, HF-dipped, hydrogen-terminated hydrophobic silicon wafers are used to realize epitaxial-like bonding after annealing at >700° C. In order for bonded hydrophobic silicon wafer pairs to reach bulk fracture energy, Tong et al. in Applied Physics Letters 64, 625 (1994) reported that hydrogen (from HF-dip, mainly Si—$H_2$ and Si—H terminated hydrophobic silicon surfaces at the bonding interface) must be removed so that strong Si—Si epitaxial bonds across the mating surfaces can be formed. The reaction is illustrated in Equation (1).

$$\text{Si—H+H—Si} \rightarrow \text{Si—Si+H}_2 \qquad (1)$$

The release of hydrogen from a stand-alone silicon wafer dipped in HF was demonstrated to start at about 367° C. from Si—$H_2$ and 447° C. from Si—H in an ultrahigh vacuum. Since hydrogen molecules become mobile in silicon only at temperatures higher than 500° C., annealing at temperatures higher than 700° C. have been found necessary to completely deplete hydrogen from the bonding interface that results in a high bonding energy. Therefore, the smart-cut method for a layer transfer using conventional HF-dipped silicon wafer pairs is not possible because the bonding energy is too low at layer transfer temperatures that are lower than 500° C.

Based on above arguments, it becomes clear that the development of a low temperature epitaxial-like wafer bonding technology that is both cost-effective and manufacturable is essential for many advanced materials and device applications.

SUMMARY OF THE INVENTION

Accordingly, one object of this invention is to provide a wafer bonding method and bonded structure in which epitaxial-like bonding is achieved at near room temperature in ambient conditions without an external pressure.

Another object of this invention is to provide a wafer bonding method and bonded structure using bonding surfaces treated to obtain amorphized or partially amorphized surfaces by ion implantation or plasma, preferably by boron-containing ions or plasma.

These and other objects of the present invention are provided by a method for bonding first and second substrates including steps of preparing substantially oxide-free first and second surfaces of respective first and second substrates, creating a surface defect region in each of said first and second surfaces, and bonding said first and second surfaces. Creating the defective region may include plasma-treating the first and second surfaces of the first and second substrates with a plasma, and preferably a boron-containing plasma. The plasma-treating step may utilize a plasma in reactive ion etch (RIE) mode using $B_2H_6$ gas, and possibly a mixture of $B_2H_6$, He, and Ar gases. Other gas plasmas, such as Ar may also be used.

As a result of the plasma-treating step, a thin amorphous layer may be formed in the first and second surfaces. A monolayer of boron may also be on said first and second surfaces and first and second surfaces may be doped with boron when a boron-containing plasma is used. Also, a few monolayers of boron are introduced into each of the first and second surfaces during said plasma-treating step.

After contacting, the substrates are maintained in contact, preferable under low vacuum but also in ambient air. A bonding energy of about 400 mJ/m$^2$ may be obtained at room temperature. Also, when the bonded pair of substrates is maintained at a temperature no more than about 250° C. after contacting, a bond strength of at least about 1500 mJ/m$^2$ may be obtained, and a bonding energy of about 2500 mJ/m$^2$ (bulk silicon fracture energy) may be obtained at 350° C. The method may also include step of annealing said bonded first and second surfaces at a temperature in the range of about 250-450° C., or at a temperature not exceeding about 350° C. A substantial portion of said amorphous layers in said first and second surfaces may be recrystallized, possibly in a separate annealing step.

The creating step may also include ion-implanting the first and second surfaces. As or B may be used to implant the surfaces. In the case of B, a surface layer is formed on the surface of the substrate and the energy of the implant is chosen to place the peak of the concentration profile at approximately the interface between the substrate surface and the surface layer. In the case of As, the surface is directly implanted and a thicker amorphous layer may be formed.

After contacting, the implanted substrates are maintained in contact, preferable under low vacuum but also in ambient air. The bonded pair may be heated at a temperature no more than about 400° C. The bonded pair of substrates may be maintained at a temperature no more than about 400° C. after contacting. A bonding energy of about 2500 mJ/m$^2$ (bulk silicon fracture energy) may be obtained.

To obtain the substantially oxide-free surfaces, the substrates may be immersed in a first etching solution, such as a hydrofluoric acid solution, before said plasma-treating step, and immersed in a second etching solution, such as a hydrofluoric acid solution, after said plasma-treating step. The substrates may be cleaned before immersing in the first etching solution, preferably using an RCA-1 solution.

The method may also include plasma treating an exposed surface of the bonded pair of substrates in a boron-containing plasma, and bonding a third wafer to said exposed surface.

The method may also include creating the defect region or amorphous layer in the surface of a silicon layer formed on a semiconductor device wafer. Two or more of the treated wafers may be bonded together.

The first and second substrates may be selected from Si, InGaAs, InP, GaAs, Ge, SiC and other semiconductors.

The objects of the invention may also be achieved by a method including amorphization of first and second surfaces of first and second silicon substrates by ion implantation or plasma, and contacting the first and second surfaces to form a bonded pair of substrates. The substrates may be immersed in a first hydrofluoric acid solution before said amorphization step, and immersed in a second hydrofluoric acid solution after said amorphization step by plasma. The substrates may be cleaned before immersing in the first hydrofluoric acid solution, preferably using an RCA-1 solution.

The amorphization step may utilize arsenic (As) ion implantation or argon (Ar) RIE plasma.

After contacting, the substrates are maintained in contact, preferable under low vacuum but also in ambient air. The bonded pair may be heated at a temperature no more than about 400° C. The bonded pair of substrates may be maintained at a temperature no more than about 400° C. after contacting. A bonding energy of about 2500 mJ/m$^2$ (bulk silicon fracture energy) may be obtained. The bonded amorphous layers at the bonding interface can be completely recrystallized after annealing at 450° C.

The objects of the invention may also be achieved by a bonded structure having a first substrate having a first surface, a first amorphous layer formed in the first surface, and a second substrate having a second surface, a second amorphous layer formed in the second surface. The first surface is bonded to the second surface to form a bonded pair of substrates.

One of said first and second substrates of said bonded pair may have a third surface with an amorphous layer. A third substrate having a fourth surface, with a fourth amorphous layer formed in said fourth surface may be bonded to the bonded pair.

The first and second surfaces may comprise a surface exposed to boron-containing plasma. One of the first and second substrates of the bonded pair may have a planar surface exposed to boron-containing plasma bonded to a third surface of a third substrate exposed to boron-containing plasma. The first, second and third substrates may be selected from Si, InGaAs, InP, GaAs, Ge, SiC and other semiconductors.

The first and second substrates may comprise respective first and second semiconductor devices, the first surface may comprise a substantially planar surface of a first silicon layer formed on the first device, and the second surface may comprise a substantially planar surface of a second silicon layer formed on the second device.

The first surface may comprise a first silicon surface exposed to an inert gas plasma, and the second surface may comprise a second silicon surface exposed to an inert gas plasma.

The first surface may comprise a first silicon surface implanted with boron, and the second surface may comprise a second silicon surface implanted with boron.

The first surface may comprise a first silicon surface implanted with arsenic, and the second surface may comprise a second silicon surface implanted with arsenic.

The bonded structure according to the invention may include a first substrate having an amorphized first surface and containing boron and a second substrate having an amorphized second surface and containing boron, with the first surface being bonded to the second surface to form a bonded pair of substrates. The first and second substrates may be selected from Si, InGaAs, InP, GaAs, Ge, SiC and other semiconductors.

The first surface may comprise a first silicon surface exposed to a boron-containing plasma, and the second surface may comprise a second silicon surface exposed to a boron-containing plasma.

The first surface may comprises a first silicon surface implanted with boron, and the second surface may comprise a second silicon surface implanted with boron.

The bonded structure may also have a first substrate having a first surface implanted with boron, and a second substrate having a second surface implanted with boron. The first surface is bonded to said second surface to form a bonded pair of substrates. One of the first and second substrates of the bonded pair may have a planar surface implanted with boron. A third surface, implanted with boron, of a third substrate may be bonded to the planar surface. The first, second and third substrates may be selected from Si, InGaAs, InP, GaAs, Ge, SiC and other semiconductors.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
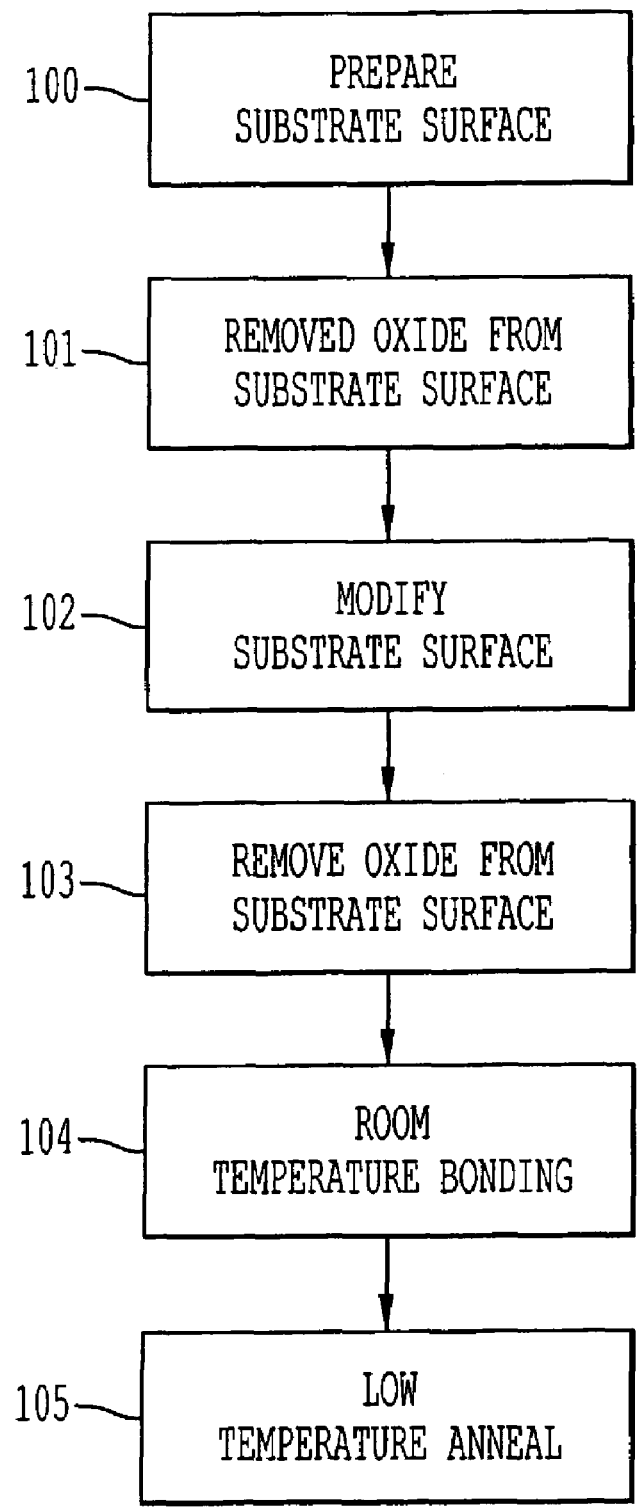
FIG. 1 is a flow chart illustrating method steps of the present invention.

Referring now to the drawings, wherein like reference numerals designate identical or corresponding parts throughout the several views, and more particularly to FIG. 1 thereof, FIG. 1 shows method steps of the present invention. In step 100, the substrates are cleaned using, for example, a wet RCA-1 ($H_2O+H_2O_2+NH_4OH$) solution. Other cleaning methods are possible, such as $H_2SO_4+H_2O_2$ or dry clean. Following the cleaning step using the RCA-1 solution, the substrates are immersed in step 101 in a hydrofluoric acid aqueous solution such as 1% HF solution to remove the surface thin native oxide layer. Upon removal from the hydrofluoric acid solution, the surfaces of the substrates are modified by creating surface and/or subsurface damage areas by ion implantation or plasma, preferably using boron-containing ions or boron-containing plasma, in step 102. By subsurface, it is meant at least the layer of atoms below the surface layer. The treatment may approach or reach amorphization to form a thin amorphous layer in the surface of the substrates. The surface treatment, when using boron, may introduce boron into the substrate surface.

Upon termination of the treatment, the substrates in step 103 are immersed in a dilute hydrofluoric acid aqueous solution such as 1% HF solution to remove the surface thin native oxide layer or any other oxide formed on the surface. Surfaces of the substrates which were treated in step 103 are placed together in step 104 at room temperature in atmosphere and form a room temperature bonded substrate pair. The attached substrate pair is preferably placed inside a low vacuum system, but may also be placed in ambient. The bonded pair is then annealed at low temperatures in step 105. The temperature may be selected to recrystallize the thin amorphous layers formed during the ion implantation or plasma treatment. Recrystallization may also be carried out in a separate annealing procedure. The wafer bonding method of the present invention achieves high bonding energy near room temperature.

Figure 2A:
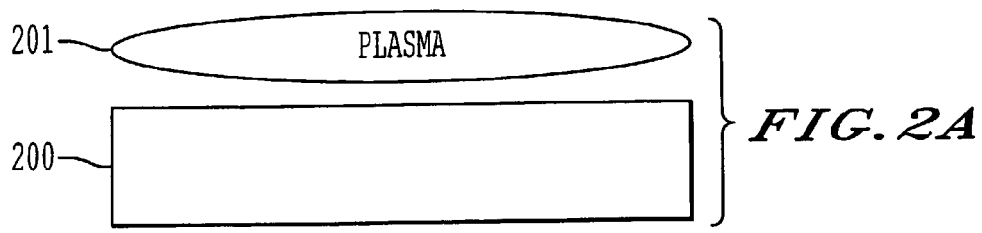
FIGS. 2A-2E are sectional diagrams illustrating a first embodiment of the method according to the invention, and a bonded structure according to the invention.
Figure 2B:
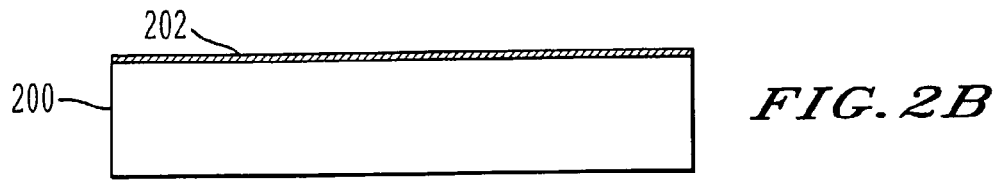
Figure 2C:
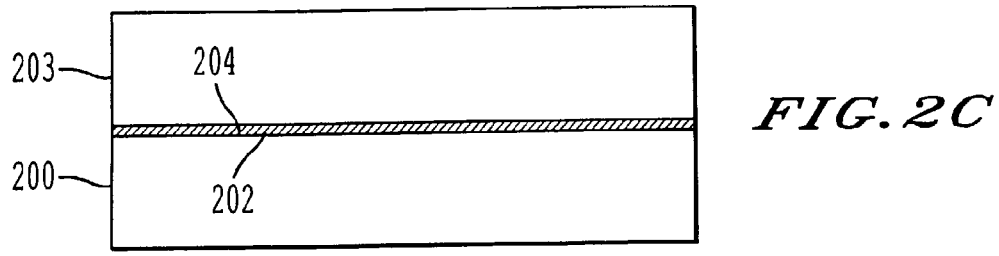
Figure 2D:
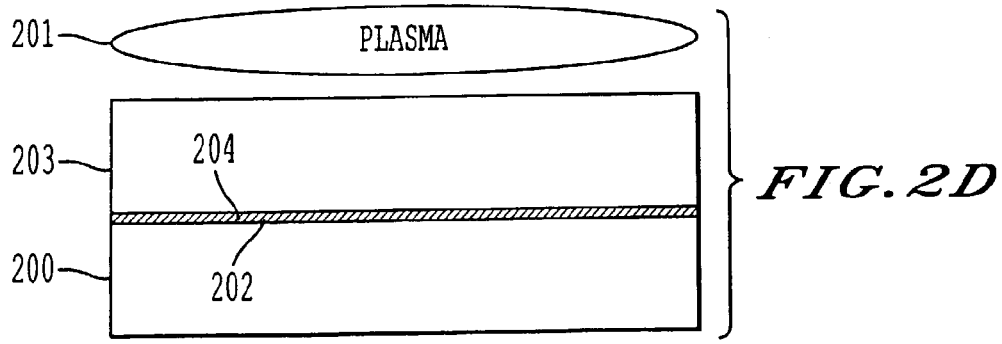
Figure 6:
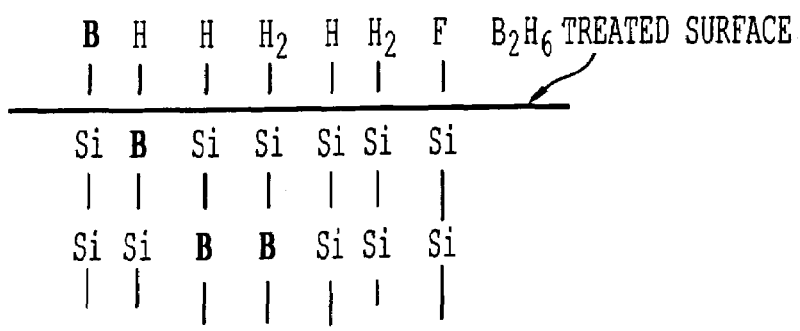
FIG. 6 is a schematic of surface terminations on $B_2H_6$ plasma treated and HF dipped silicon wafers.

FIGS. 2A-2E show sectional views of the first embodiment of the method according to the invention. In FIG. 2A, a substrate 200, after immersing in the aqueous HF solution, is exposed to a plasma 201. FIG. 2B illustrates wafer 200 after the plasma treatment. The plasma modifies the surface 202 of the wafer to create defect areas and possibly a thin amorphous layer. Subsurface (the layer adjacent the surface) defect areas may also be formed. Surface 202 is drawn with a heavier line to illustrate the defective area or amorphous layer formed by the plasma treatment. The amorphous layer formed is about a few nm or more in thickness. In a preferred case, the plasma is a boron-containing plasma and, most preferably, a $B_2H_6$ plasma. The position of the B in the surface structure will be described below in connection with FIG. 6.

Figure 2E:
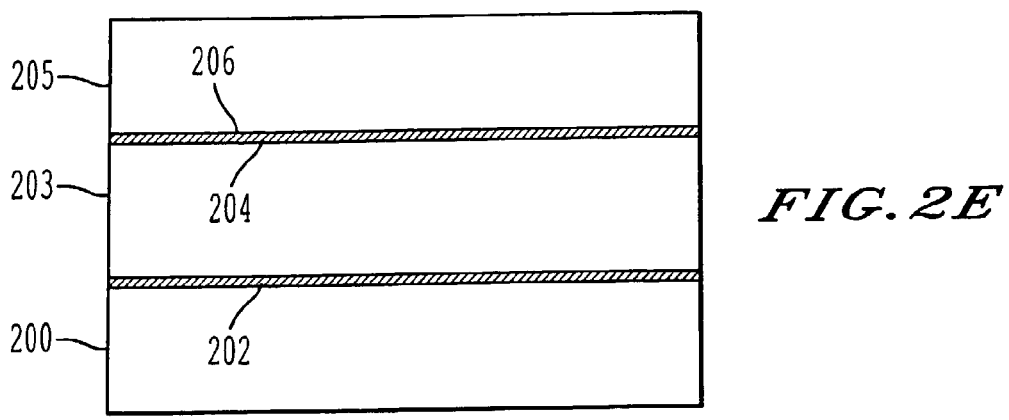

The wafer is immersed in the aqueous HF solution as described above. Another wafer 203 having a similarly plasma treated surface 204 is placed in contact with wafer 200 with surfaces 202 and 204 directly contacted to form the bonded structure at room temperature in FIG. 2C. The bonded structure is annealed at a low temperature and is then ready for further processing, such as low-temperature annealing, substrate lapping, device formation, etc., or a combination of processes. The process may be continued by plasma-treating the exposed surface 205 of wafer 203 (FIG. 2D) and bonding it to another plasma-treated surface 207 of wafer 206 (FIG. 2E). Any number of substrates may be bonded together.

EXAMPLE 75 mm diameter, 1-10 ohm-cm, p-type Si (100) substrate wafers were used. The wafers were cleaned in a RCA-1 solution, dipped in a 1% hydrofluoric aqueous solution followed by treatment in $B_2H_6$ plasma for an appropriate time period depending on the plasma system used. Appropriate plasma treatment times have ranged from 30 sec. to 5 min. The $B_2H_6$ plasma treatment consisted of a mixed gas of 20 sccm of 0.5% $B_2H_6$/99.5% He and 20 sccm Ar in an inductor coupled plasma (ICP) operating in a reactive ion etch mode with a RF power of 38 W at a pressure of ~5 mTorr. A ~100 V self-biased voltage was generated. This self-bias is the lowest possible self-bias for a stable plasma treatment in the plasma treatment system used herein. The wafers were then dipped in a diluted 1% HF solution to remove any oxide on the wafer surfaces. The wafers were then placed together without water rinse and bonded in air at room temperature.

Figure 3:
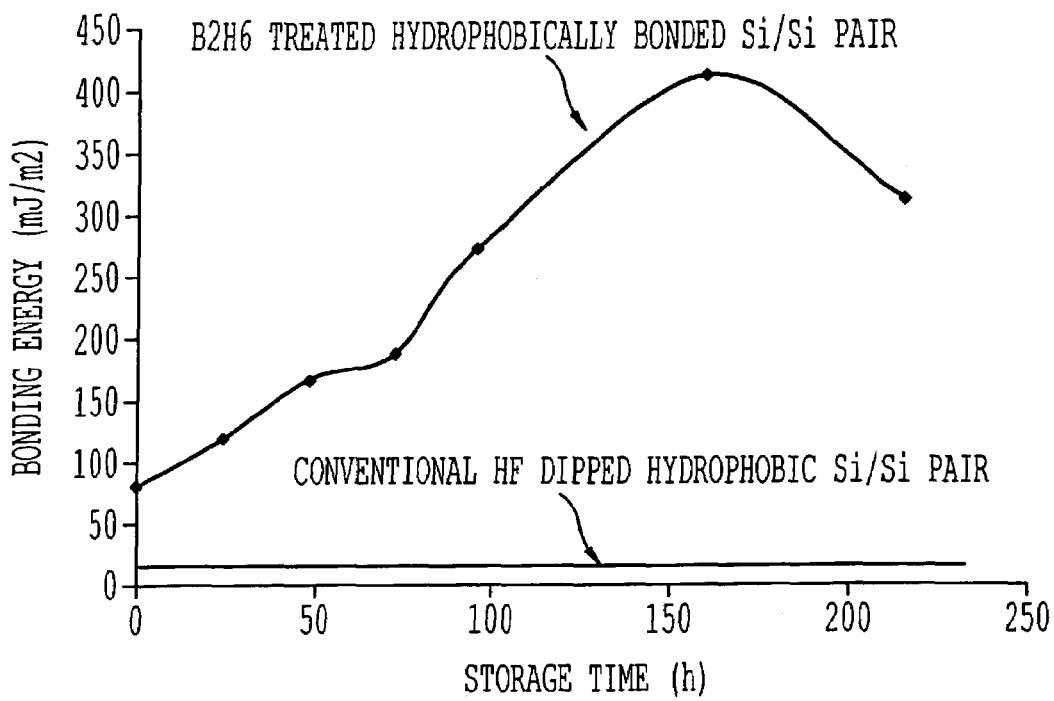
FIG. 3 is graph depicting room temperature bonding energy as a function of storage time of bonded pairs of $B_2H_6$ treated hydrophobic silicon wafers.

The bonded wafer pair was stored in a low vacuum chamber at a vacuum level of about, for example, 700 Pa. The vacuum level is not critical. The bonding energy (specific surface energy) of the bonded pairs was determined by measuring the crack length introduced by inserting a razor blade into the bonding interface to partially separate the two wafers. FIG. 3 shows the room temperature bonding energies as a function of storage time for $B_2H_6$ plasma-treated hydrophobic bonded silicon wafers. Compared with a typical room temperature bonding energy of ~10-20 mJ/m² for conventional HF-dipped silicon wafer pairs, the bonding energy of ~400 mJ/m² for the $B_2H_6$ treated pairs is remarkably higher. A few interface bubbles were formed during low vacuum storage at room temperature, which supports the latter explanation that hydrogen released from the bonding interfaces is responsible for the increase of bonding energy at room temperature.

Figure 4:
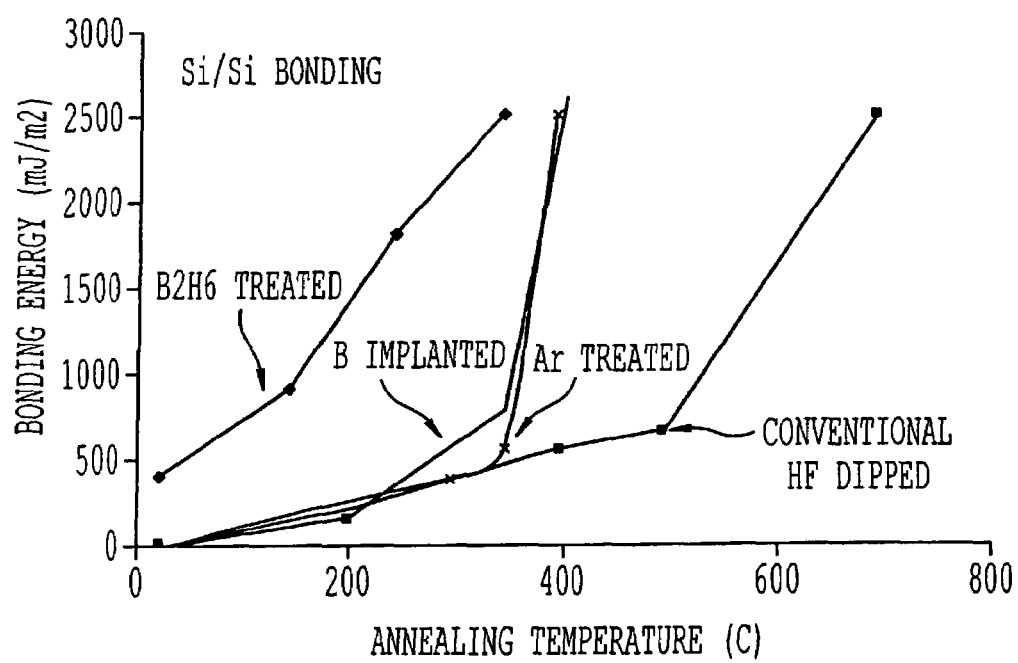
FIG. 4 is a graph depicting bonding energy as a function of annealing temperature of $B_2H_6$ treated, boron-implanted treated, Ar plasma treated, and conventional hydrophobic (HF dipped only) silicon wafer pairs.

Bonding energy as a function of annealing temperature of $B_2H_6$ treated, boron-implanted treated, Ar plasma treated, and conventional hydrophobic (HF dipped only) silicon wafer pairs is shown in FIG. 4. It is important to note that for the $B_2H_6$ plasma treated samples, the bonding energy was ~900 mJ/m² at 150° C. and ~1800 mJ/m² at 250° C., and reaches the fracture energy of bulk silicon ~2500 mJ/m² at 350° C. For comparison, FIG. 4 also shows the bonding energy as a function of annealing temperature of conventional HF dipped silicon wafer pairs. TEM (Transmission Electron Microscopy) measurements have shown that the expitaxial bonding interface in the Si/Si bonded pairs was realized after 350° C. annealing.

Figure 5:
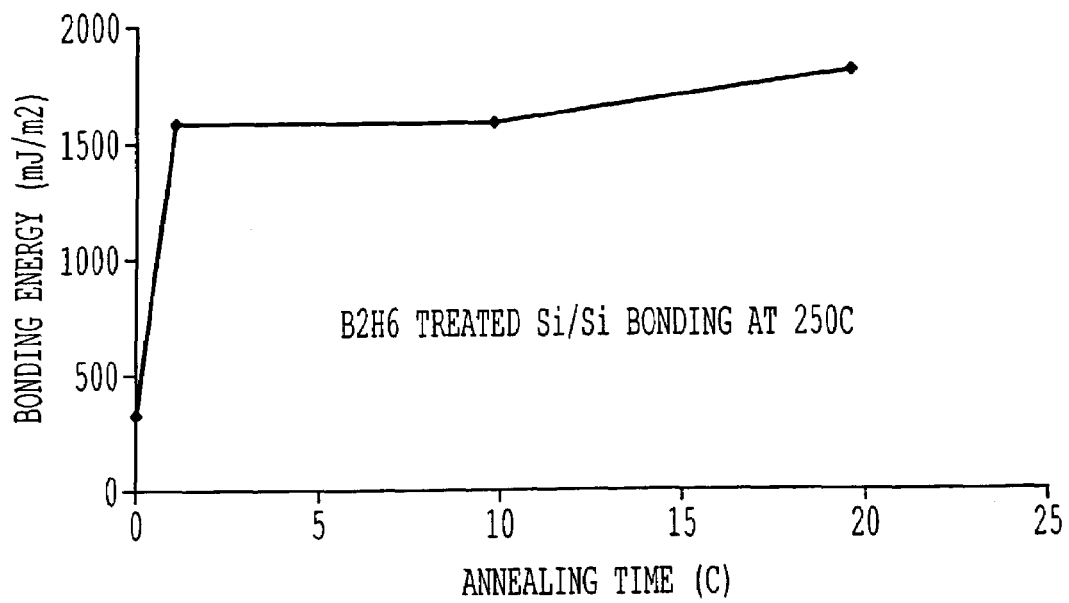
FIG. 5 is a graph depicting bonding energy as a function of annealing time at 250° C. for $B_2H_6$ treated wafer pairs.

A typical example of bonding energy as a function of annealing time at 250° C. is shown in FIG. 5. The bonding energy increases quickly with annealing time and is saturated after ~20 h annealing at 250° C. A few bubbles were generated during annealing indicating that the increase in bonding energy is associated with the release of hydrogen at the bonding interface.

The $B_2H_6$ plasma treatment of present invention places boron not only on the surface but also in subsurface layers due to the self-bias voltage. After the HF dip, in addition to Si—$H_2$, Si—H and Si—F surface terminations, the $B_2H_6$ plasma-treated silicon surfaces will likely be terminated by Si—B:H from top surface boron atoms forming Si—B groups, by Si—B—H groups by boron at the first surface layer, and by Si—H and Si—$H_2$ groups that have subsurface boron atoms terminated to the silicon atoms, see FIG. 6. The bonding interface between the silicon wafer pair is most likely bridged by HF molecules resulting from the HF dip that can be removed by storage in low vacuum or in ambient at room temperature.

Since B—H complexes are very weakly polarized due to their similar electronegativity, the following reactions at the bonding interface are likely responsible for the increase in bonding energy at room temperature:

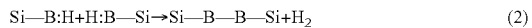

(2)

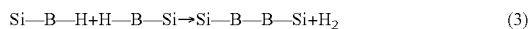

(3)

The removal of hydrogen terminations on the boron atoms leads to a Si—B—B—Si bridging bond attaching one substrate to another. Moreover, as reported by Kim et al. in Applied Physics Letters 69, 3869 (1996), subsurface boron in the second layer weakens the surface Si—H bond. Hydrogen desorption from the bonding surfaces of $B_2H_6$ treated silicon wafers can take place at low temperatures resulting in a silicon covalent bond formation across the interface between the substrates as shown by the following reaction:

(4)

The boron-assisted reaction completely depletes hydrogen from the bonding interface at temperatures of 350-400° C. which is lower than a 700° C. temperature which is required for conventional HF dipped silicon substrate bonding, when no boron is present.

In a second embodiment, an inert gas plasma is used to create the defective area and thin amorphous layer. The third embodiment preferably uses an Ar-only plasma treatment to enhance the bonding energy at low temperatures, also shown in FIG. 4. Method steps for an Ar-only plasma treatment bonding process follow all the steps shown in FIG. 1. After cleaning in RCA1 solution (step 100), silicon wafers are dipped in 1% HF solution to remove the native oxide layer of any other oxide layer (step 101). The wafers are placed in the RIE plasma system and treated with Ar plasma in 30-100 mtorr for 15 seconds to 20 minutes. Ar plasma is generated by applying a RF power from 80-200 W at 13.56 MHz (step 102). The surface self-bias voltage is in the range of 200 V to 400 V. These Ar plasma treated wafers are dipped in 1% HF to remove any surface oxide layer (step 103) and bonded at room temperature in air (step 104). After storage in low vacuum for ~20 hrs (step 105), the bonded pairs are annealed. The bonding energy reaches the bulk silicon fracture energy (2500 mJ/m²) at 400° C. The bonding energy enhancement is likely due to that the amorphous layer formed by the Ar plasma treatment readily absorbs the hydrogen released from surface Si—$H_2$ and Si—H groups that takes place at about 300° C. The amorphous layer at the bonding interface may be recrystallized at low temperatures. Ar-only plasma treatment to enhance low temperature epitaxial-like bonding is especially attractive for applications that requires no monolayers of boron at the bonding interface.

Figure 7:
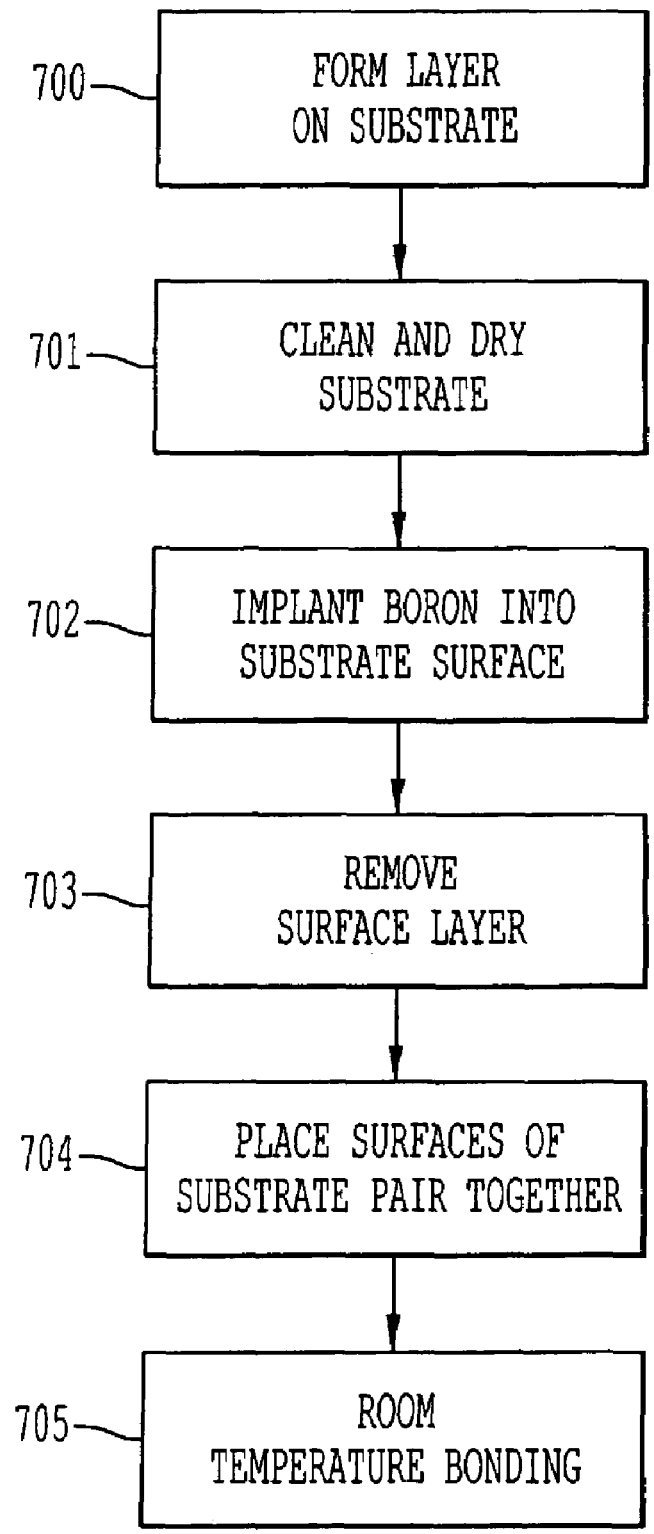
FIG. 7 is a flow chart showing a second embodiment of the method according to the present invention.

A third embodiment of the present invention (shown in FIG. 7) is to use ion implantation to place boron onto the surfaces of bonding substrates. In step 700, the substrates are covered by a masking layer, preferably an oxide layer. The substrates are cleaned using, for example, a wet RCA-1 solution and dried in step 701. Surfaces of the substrates are implanted with boron using $BF_3$ as shown in step 702 to place the boron concentration peak at the oxide/silicon interface. As an example, forming an 800 Å thick thermal oxide on silicon wafers, boron implantation at an energy of 20 keV with a dose of $5 \times 10^{14}$/cm² places boron concentration peak of $6 \times 10^{19}$/cm² at the oxide/silicon interface. Employing a 6700 Å thick thermal oxide on silicon wafers, boron implantation at an energy of 180 keV with a dose of $5 \times 10^{14}$/cm² places boron concentration peak of $2.5 \times 10^{19}$/cm² at the oxide/silicon interface.

Following boron implantation, the substrates in step 703 are immersed in a dilute hydrofluoric acid solution to remove the oxide layer. Surfaces of the substrates which were boron-implanted in step 702 are bonded at room temperature in step 704. The attached pair is preferably placed inside a low vacuum system and annealed in air at low temperature in step 705.

Boron implantation in bonding silicon wafers can achieve the bulk silicon fracture energy at ~400° C. The bonding energy enhancement at room temperature seen with the boron plasma treated wafers is not achieved. Instead, a significant increase in bonding energy is seen at temperatures above than 300° C., as shown in FIG. 4. It is likely that lower boron concentrations on the wafer surfaces for the boron implantation treatment in comparison to the plasma treatment case delays bonding enhancement until higher annealing temperatures are used.

Released hydrogen shown in equation (4) can build an internal pressure that offsets the bonding strength at the bonding interface. In order to alleviate the internal gas pressure, released hydrogen molecules need to be removed from the interface. The plasma or ion implantation treatment according to the invention induces a defective surface layer towards amorphization providing hydrogen trapping sites. Plasma or ion implantation treatments using other gases containing boron are expected to work as well.

Figure 8A:
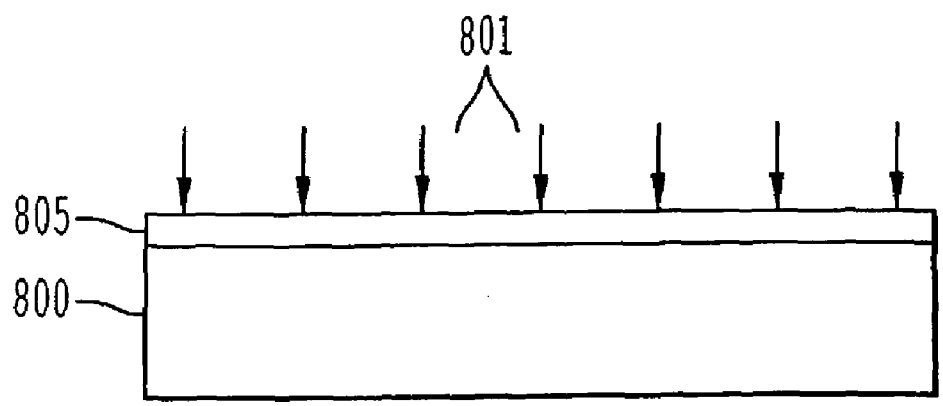
FIGS. 8A-8C are sectional diagrams illustrating a second embodiment of the method according to the invention, and a bonded structure according to the invention.
Figure 8B:
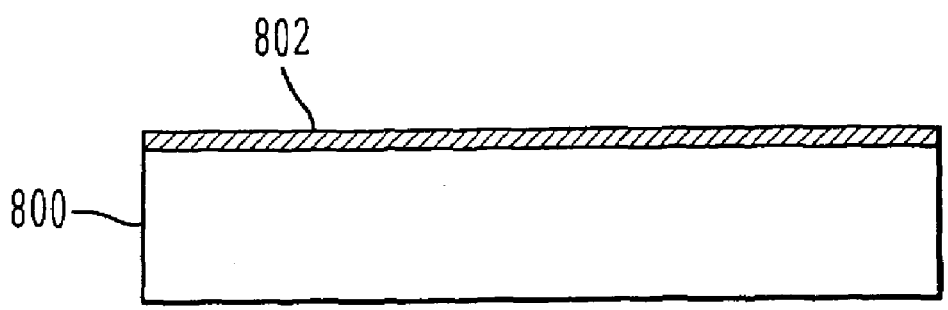
Figure 8C:
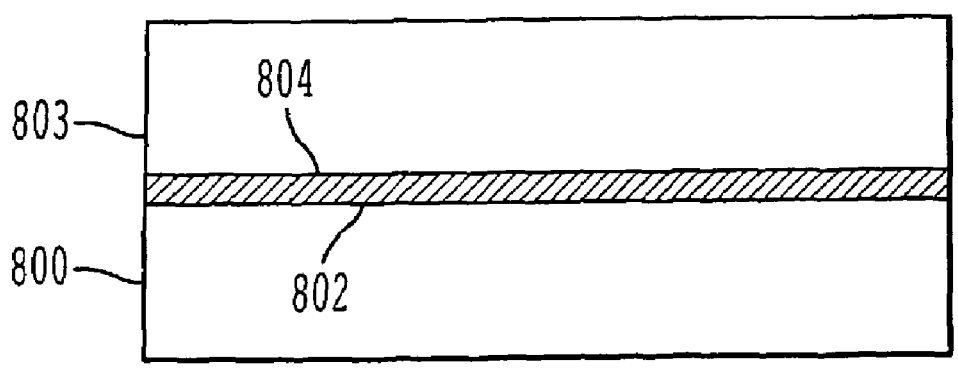

FIGS. 8A-8C show cross sectional views of the third embodiment of the method. Ions 801 are implanted into a wafer 800 having a masking film 805, such as $SiO_2$, formed on the surface, as shown in step 8A. The masking film 805 allows the energy of the implant to be adjusted so that the peak of the concentration distribution is at the surface of wafer 800. As shown in FIG. 8B, the wafer 800 has a modified surface 802 (shown with heavier line for illustrative purpose only) after removing the masking layer by immersing in an aqueous HF solution, in the case of layer 305 being $SiO_2$. Another wafer 803 similarly treated with a modified surface 804 is placed in contact with wafer 800 at room temperature. The bonding of the two wafers is allowed to enhance with low-temperature annealing, as discussed above.

Figure 10:
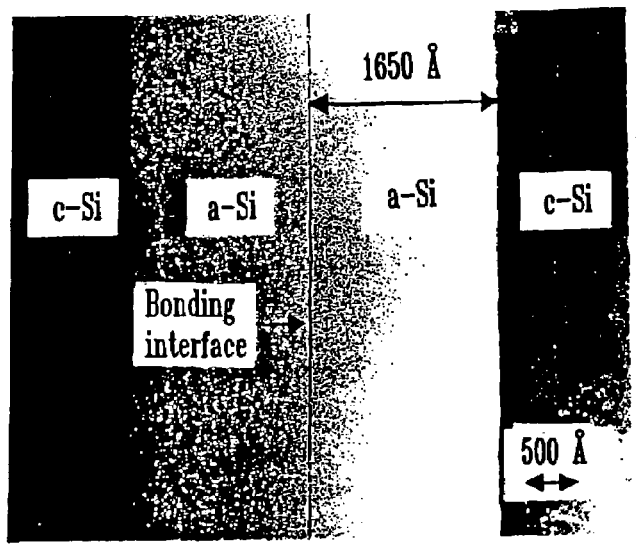
FIG. 10 is an TEM (Transmission Electron Microscopy) image of an As-implanted amorphous-Si/amorphous-Si (a-Si/a-Si) bonding interface.

A fourth embodiment of the present invention is to use As (arseniic) ion implantation to silicon wafers to form an amorphous layer on the wafer surface. Method steps for an As ion implantation treatment bonding process follow the steps shown in FIG. 1. After cleaning and removing any oxide layer, As ion implantation is performed at an energy of 180 keV with a dose of $9 \times 10^{14}/cm^2$. Any oxide layer then is removed prior to bonding. The As doping concentration peak of $8 \times 10^{19}/cm^3$ is located at ~1150 Å from the silicon surface. Although this implantation induced a very low As doping on the wafer surface, an amorphous layer with 1650 Å thick was formed as confirmed both by a Monte Carlo simulation and TEM measurement (FIG. 10). The thickness of the amorphous layer can vary and is not limited to the value of this example. For instance, other ions may be implanted to create the amorphous layer. Arsenic is a dopant, and there are applications when it is desired not to dope the substrate so another ion, such as a non-doping ion like Ar, would be chosen.

Figure 9:
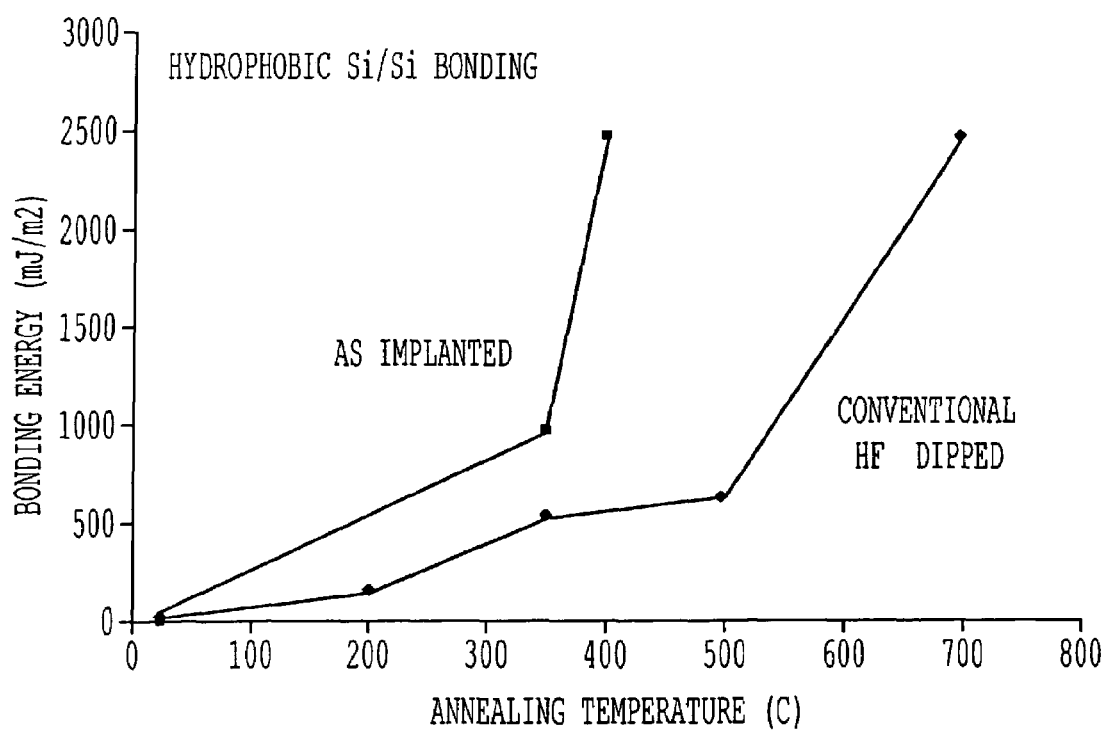
FIG. 9 is a graph depicting bonding energy as a function of annealing temperature.

After an HF dip to remove any oxide on the implanted surfaces, the wafers are bonded at room temperature in ambient conditions. After storage in low vacuum for ~20 h the bonded pairs are annealed in air. The bonding energy as a function of annealing temperature is shown in FIG. 9. The bonding energy reaches the bulk silicon fracture energy (2500 $mJ/m^2$) at 400° C. Bonded pairs of the As implanted silicon wafers that were annealed at 900° C. to fully recrystallize the amorphous layers before bonding have shown the same bonding energy of ~400 $mJ/m^2$ as the conventional HF dipped Si/Si pairs after 400° C. annealing. It is clear that as in the Ar plasma treatment case, the amorphous layers rather than As doping at the bonding interface play a key role in enhancing bonding energy at low temperatures.

Figure 11:
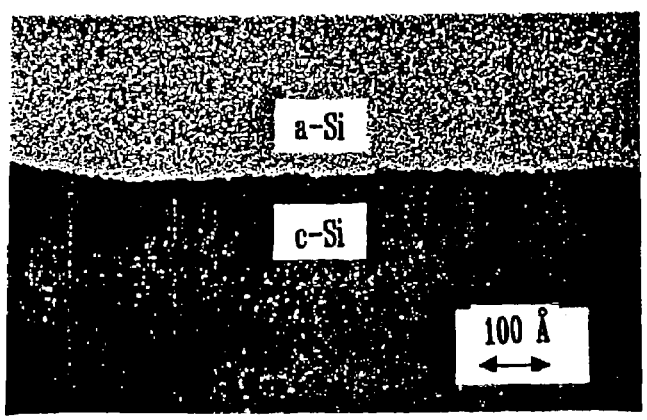
FIG. 11 is a HRTEM (High Resolution TEM) image of an As-implantation induced amorphous layer in a bonding wafer.
Figure 12:
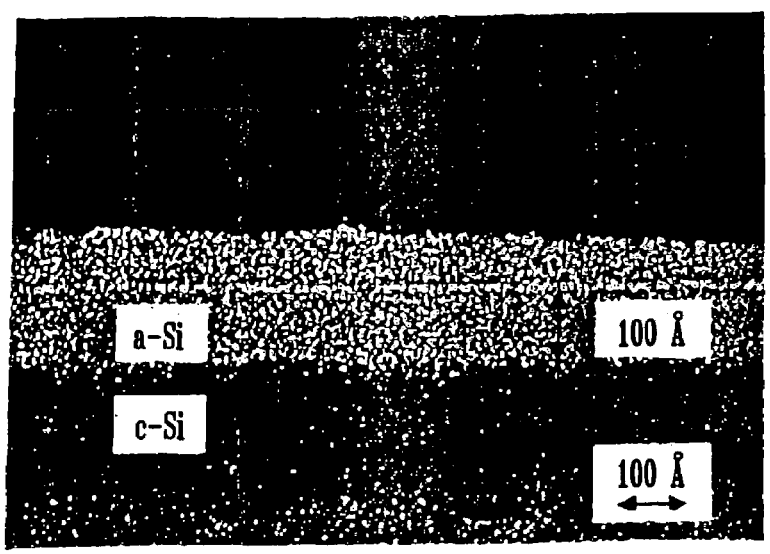
FIG. 12 is a HRTEM image for an As-implanted bonded pair after annealing.

FIGS. 10-12 show TEM images of the As-implanted substrates, and As-implanted bonded substrate pairs. In FIG. 10, a TEM image of bonding interface between the amorphous silicon layers (a-Si/a-Si) that were formed by As implantation is shown. FIG. 11 shows an HRTEM image of the interface between the amorphous silicon and the crystal silicon substrate (a-Si/c-Si). The amorphous layer is reduced to 100 Å in thickness after annealing for 24 hours at 450° C., as shown in FIG. 12.

Figure 13:
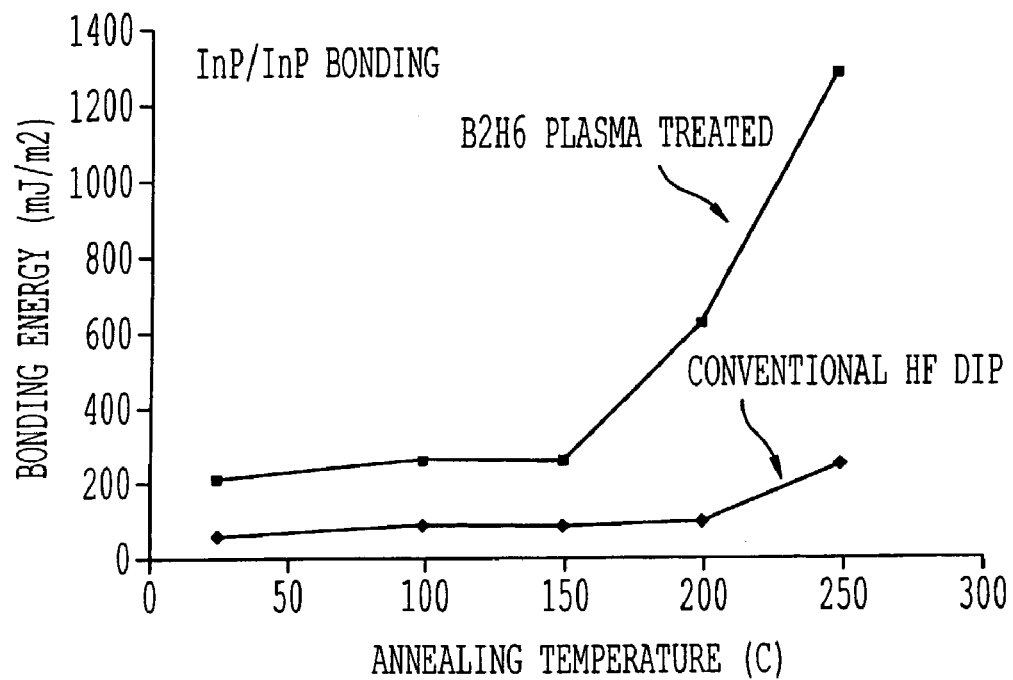
FIG. 13 is a graph depicting bonding energy as a function of annealing temperature of $B_2H_6$ treated InP/InP wafer pairs.

The above methods can be applied to other substrate combinations involving materials such as InP, GaAs, Ge, SiC, etc. Using the $B_2H_6$ plasma treatment process described in the first embodiment to InP/InP epitaxial-like wafer bonding, the bonding energy of the bonded InP/InP pairs reached the (100) InP bulk fracture energy of ~600 $mJ/m^2$ after annealing at 200° C. for 24 h. FIG. 13 shows the bonding energy as a function of annealing temperature of the $B_2H_6$ treated InP/InP wafer pairs. For comparison, the bonding energy as a function of annealing temperature of conventional HF dipped InP/InP pairs is also shown.

Figure 14:
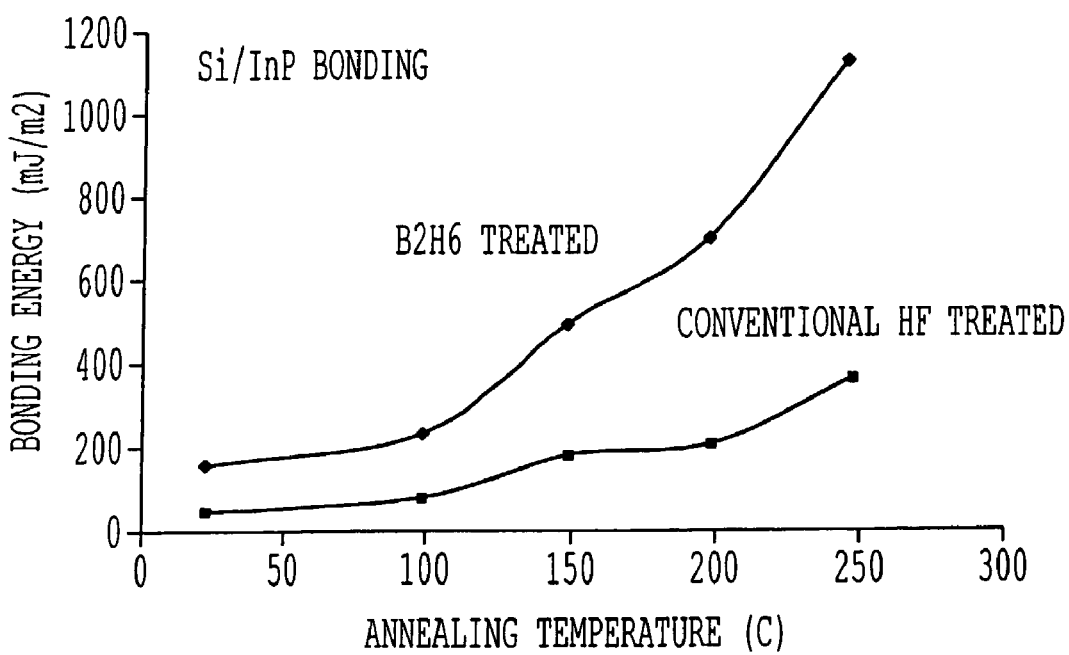
FIG. 14 is a graph depicting bonding energy as a function of annealing temperature of $B_2H_6$ treated Si/InP wafer pairs.
Figure 15A:
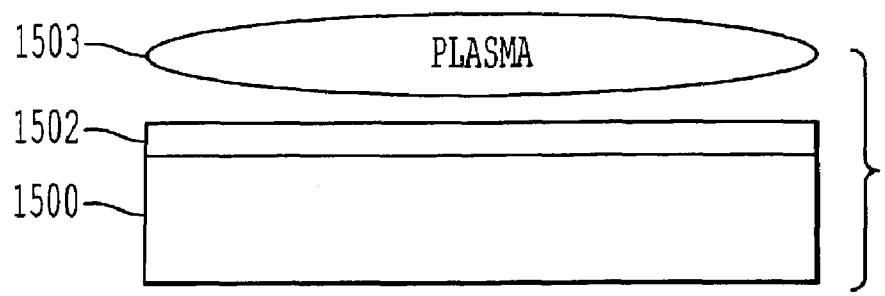
FIGS. 15A-15C are diagrams of a forming a bonded structure according to the invention.
Figure 15B:
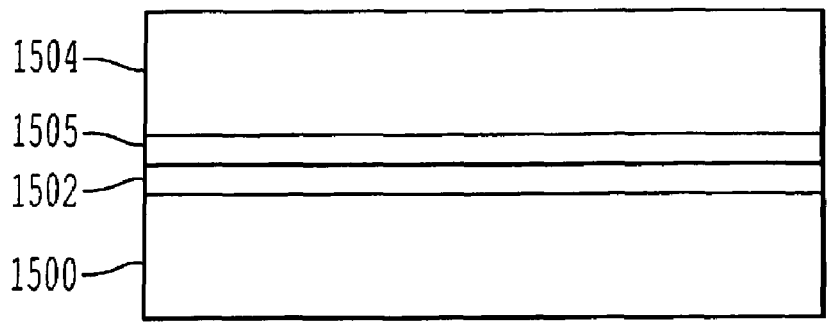
Figure 15C:
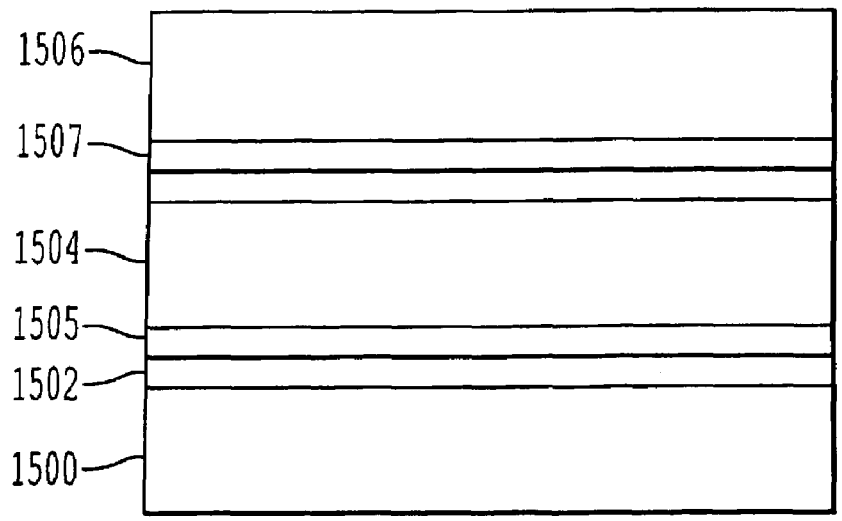
Figure 16A:
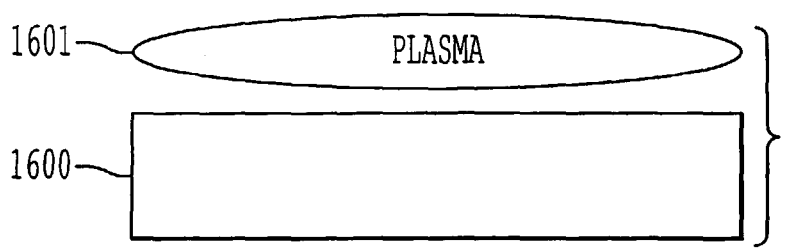
FIGS. 16A-16E are diagrams of a forming a bonded structure according to the invention.
Figure 16B:
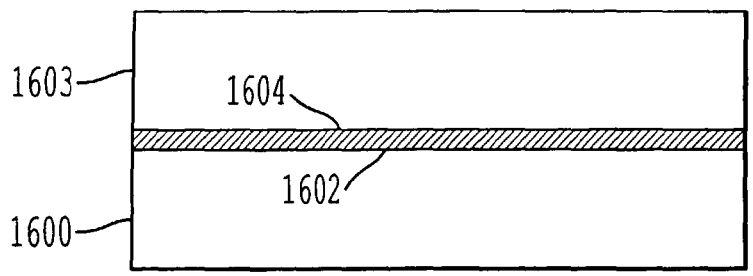
Figure 16C:
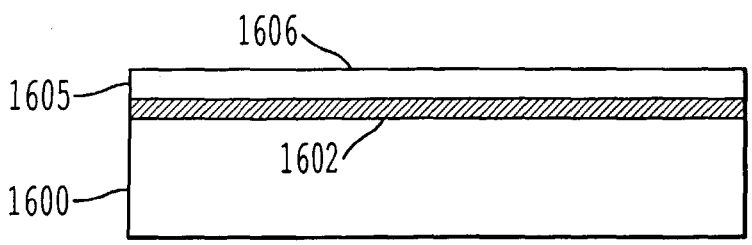
Figure 16D:
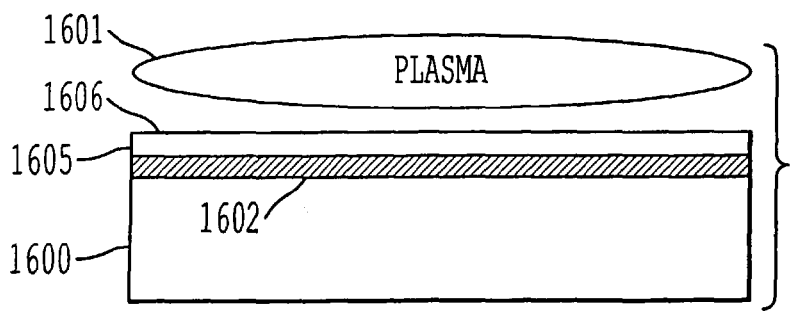
Figure 16E:
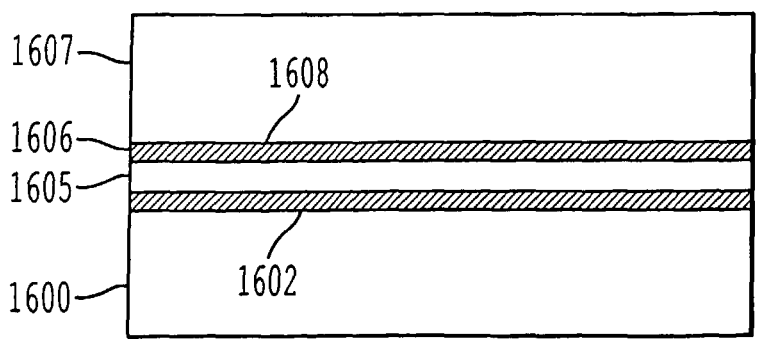

The similar results were obtained for bonding a silicon wafer to an InP wafer. Using the $B_2H_6$ plasma treatment process described in the first embodiment to Si/InP epitaxial-like wafer bonding, the bonding energy of the bonded Si/InP pairs reached the (100) InP bulk fracture energy of ~600 $mJ/m^2$ after annealing at 200° C. for 24 h. FIG. 14 shows the bonding energy as a function of annealing temperature of the $B_2H_6$ treated Si/InP wafer pairs. For comparison, the bonding energy as a function of annealing temperature of conventional HF dipped Si/InP pairs is also shown Two or more wafers having a silicon layer formed on the surface may also be bonded, as shown in FIGS. 15A-15C. Silicon layer 1502 of substrate 1500 is exposed to plasma 1503 in FIG. 15A. A similarly treated surface 1505 of wafer 1504 is placed in contact with surface 1502 and bonded (FIG. 15B). Surface 1505 may also be ion-implanted. The exposed surface of substrate 1504 may also be exposed to a plasma and bonded with treated surface 1507 of wafer 1506 to form a three-substrate bonded structure, as shown in FIG. 15C. These wafers may be processed wafers having devices and/or circuits formed therein with the silicon layer formed after device and/or circuit formation. The silicon layer should be planar, and may be planarized using techniques such as CMP. The silicon layer is treated using a plasma or ion-implantation, as discussed above. This structure preferably used the boron-containing plasma or boron implantation. Also, unique device structures such as double-sided power diodes, pin photodiodes and avalanche photodiodes may be realized. While the above embodiments are directed to substrates, it should be understood that a substrate may be of varying thickness. In other words, thin substrates may be bonded to other substrates, or bonded with two substrates to be between the substrates. A bonded substrate may also be thinned to a desired thickness by lapping or polishing, as discussed above. FIGS. 16A-16E illustrate this. The surface of substrate 1600 is exposed to plasma 1601 to form treated surface 1602 (FIGS. 16A and 16B). Surface 1602 has a surface defect region and may be amorphized. Another substrate 1603 with a treated surface 1604 is bonded to surface 1602 (FIG. 16B). In FIG. 16C, a portion of substrate 1603 is removed by lapping, polishing, etc. to leave portion 1605 with surface 1606. Surface 1606 may then be exposed to a plasma (FIG. 16D) and another wafer 1607 with treated surface 1608 may be bonded to surface 1606 (FIG. 16E). Unique structures where different materials of desired thicknesses may be bonded and formed according to the invention.

Some advantages of the wafer-bonding process of the present invention are that the process utilizes manufacturable steps which bond wafers at room temperature in ambient air and annealed at temperatures no higher than 450° C. to reach an epitaxial-like bond. Pre-annealing at elevated temperatures, external pressure, or high vacuum to achieve a high bonding energy are not required. The process uses common RIE plasma treatments or ion implantation that are economic, convenient and easy to implement.

In addition to the epitaxial-like wafer bonding for materials combination for preparing advanced devices such as pin and avalanche photodiodes, the process shown here can have applications in bonding unique device structures such as bonding back sides of two fully processed power devices to form double-sided power devices, can allow the device layer transfer onto carrier substrates with an epitaxial-like interface, and can be used to transfer device layers to more thermally conductive materials thus enhancing thermal management.

Numerous other modifications and variations of the present invention are possible in light of the above teachings. It is therefore to be understood that within the scope of the appended claims, the present invention may be practiced otherwise than as specifically described herein.

What is claimed as new and desired to be secured by Letters Patents of the United States is:

1. A method for bonding first and second substrates, comprising:
preparing substantially oxide-free first and second surfaces of respective first and second substrates;
creating a surface defect region in said substantially oxide-free first surface; and
bonding said first and second surfaces,
wherein said creating step comprises:
plasma treating said first and second surfaces using a boron-containing plasma.

2. A method as recited in claim 1, comprising:
forming monolayers of boron on said first and second surfaces.

3. A method as recited in claim 1, comprising:
doping said first and second surfaces with boron.

4. A method as recited in claim 1, comprising:
bonding said first and second surfaces at about room temperature.

5. A method as recited in claim 4, comprising:
annealing said bonded first and second surfaces at a temperature in the range of about 150-350° C.

6. A method as recited in claim 4, comprising:
annealing said bonded first and second surfaces at a temperature no more than about 350° C.

7. A method as recited in claim 1, wherein said creating step comprises:
forming an amorphous layer about a few nm or more in thickness in each of said first and second surfaces.

8. A method as recited in claim 7, comprising:
forming said amorphous layer using a $B_2H_6$ plasma.

9. A method as recited in claim 1, comprising:
annealing said bonded first and second surfaces at a temperature not exceeding about 350° C.

10. A method as recited in claim 1, wherein said first and second substrates are selected from Si, InGaAs, InP, GaAs, Ge and SiC.

11. A method as recited in claim 1, comprising:
maintaining said bonded pair at room temperature; and
obtaining a bond strength of at least about 400 mJ/m$^2$.

12. A method as recited in claim 1, comprising:
heating said bonded pair at a temperature no more than about 250° C.; and
obtaining a bond strength of at least about 1500 mJ/m$^2$.

13. A method as recited in claim 1, comprising:
heating said bonded pair at a temperature no more than about 350° C.; and
obtaining bond strength of at least about 2500 mJ/m$^2$.

14. A method as recited in claim 1, comprising:
preparing a substantially oxide-free silicon substrate having said first surface; and
preparing a substantially oxide-free substrate made of one of InGaAs, InP, SiC, Ge and GaAs having said second surface.

15. A method as recited in claim 1, comprising:
forming a silicon layer on a substrate containing a first active device as said first substrate.

16. A method as recited in claim 1, comprising:
creating a surface defect region in an exposed surface of said bonded pair of substrates and in a third surface of a third substrate; and
bonding said third surface to said exposed surface.

17. A method as recited in claim 1, wherein each of said first and second substrates is substantially comprised of the same material.

18. A method as recited in claim 1, wherein said first and second substrates are substantially comprised of different materials.

19. A method as recited in claim 1, wherein said first and second substrates are substantially comprised of materials with different lattice constants.

20. A method as recited in claim 1, comprising:
forming a first layer on said first substrate; and
creating said surface defect region in said first layer.

21. A method as recited in claim 1, comprising:
plasma treating said first and second surfaces using a $B_2H_6$ plasma.

22. A method for bonding first and second substrates, comprising:
preparing substantially oxide-free first and second surfaces of respective first and second substrates;
creating a surface defect region in each of said substantially oxide-free first and second surfaces;
bonding said first and second surfaces; and
forming at least one of said defect regions using As implantation.

23. A method as recited in claim 22, wherein said creating step comprises:
forming an amorphous layer about a few nm or more in thickness in each of said first and second surfaces.

24. A method as recited in claim 22, comprising:
annealing said bonded first and second surfaces at a temperature in the range of about 250-450° C.

25. A method as recited in claim 22, comprising:
recrystallizing a substantial portion of said defect regions in said first and second surfaces.

26. A method as recited in claim 22, comprising:
preparing substantially oxide-free first and second surfaces of respective first and second substrates made of one of Si, InGaAs, InP, SiC, Ge and GaAs.

27. A method as recited in claim 22, comprising:
preparing a substantially oxide-free silicon substrate having said first surface; and
preparing a substantially oxide-free substrate made of one of InGaAs, InP, SiC, Ge, and GaAs having said second surface.

28. A method as recited in claim 22, comprising:
forming a layer of a desired thickness on said first surface;
ion implanting said first surface through said layer to create said surface defect region in said first substrate.

29. A method as recited in claim 22, comprising:
creating said surface defect region in said first substrate using said As implantation; and
creating said surface defect region in said second substrate using one of ion implantation and plasma treatment.

30. A method as recited in claim 22, comprising:
forming a silicon layer on a substrate containing a first active device as said first substrate; and
forming a silicon layer on a substrate containing a second active device as said second substrate.

31. A method as recited in claim 22, further comprising:
placing the bonded pair of substrates under vacuum.

32. A method as recited in claim 22, comprising:
creating a surface defect region in an exposed surface of said bonded pair of substrates and in a third surface of a third substrate; and
bonding said third surface to said exposed surface.

33. A method as recited in claim 22, wherein each of said first and second substrates is substantially comprised of the same material.

34. A method as recited in claim 22, wherein said first and second substrates are substantially comprised of different materials.

35. A method as recited in claim 22, wherein said first and second substrates are substantially comprised of materials with different lattice constants.

36. A method as recited in claim 22, comprising:
forming a first layer on said first substrate; and
creating said surface defect region in said first layer.

37. A method as recited in claim 22, comprising:
forming a surface defect region in a first substrate including an active device.

38. A method as recited in claim 22, comprising:
bonding said first and second substrates at about room temperature.

39. A method as recited in claim 22, comprising:
implanting As at a dose of about $9 \times 10^{14}$ cm$^{-2}$.

40. A method for bonding first and second substrates, comprising:
preparing substantially oxide-free first and second surfaces of respective first and second substrates;
creating a surface defect region in each of said substantially oxide-free first and second surfaces;
bonding said first and second surfaces; and
forming at least one of said defect regions by implanting boron-containing ions.

41. A method as recited in claim 40, comprising:
forming a layer on said first substrate;
ion implanting said boron-containing ions into said first substrate with a peak concentration of said ions located at approximately an interface between said layer and said first substrate; and removing said layer.

42. A method as recited in claim 41, comprising:
ion implanting an impurity into said second subsate with a peak concentration of said impurity located at approximately said second surface.

43. A method as recited in claim 41, wherein said creating step comprises:
forming a thin amorphous layer in said first surface.

44. A method as recited in claim 43, comprising:
forming said amorphous layer using B implantation.

45. A method as recited in claim 41, comprising:
annealing said bonded first and second surfaces at a temperature in the range of about 150-450° C.

46. A method as recited in claim 43, comprising:
recrystallizing a substantial portion of said amorphous layers.

47. A method as recited in claim 40, wherein each of said first and second substrates is substantially comprised of the same material.

48. A method as recited in claim 40, wherein said first and second substrates are substantially comprised of different materials.

49. A method as recited in claim 40, wherein said first and second substrates are substantially comprised of materials with different lattice constants.

50. A method as recited in claim 40, comprising:
forming a first layer on said first substrate; and
creating said surface defect region in said first layer.

51. A method as recited in claim 40, comprising:
forming a surface defect region in a first substrate including an active device.

52. A method as recited in claim 40, comprising:
bonding said first and second substrates at about room temperature.

53. A method as recited in claim 40, comprising:
implanting a boron-containing ion at a dose of about $5 \times 10^{14}$ cm$^{-2}$.

54. A method as recited in claim 40, comprising:
forming a layer of a desired thickness on said first surface;
ion implanting said first surface through said layer to create said surface defect region in said first substrate; and
creating said surface defect region in said second substrate using one of ion implantation and plasma treatment.

55. A method as recited in claim 40, comprising:
creating said surface defect region in said first substrate using said boron implantation; and
creating said surface defect region in said second substrate using one of ion implantation and plasma treatment.

56. A method for bonding first and second substrates, comprising:
preparing substantially oxide-free first and second surfaces of respective first and second substrates;
creating a surface defect region in each of said substantially oxide-free first and second surfaces;
bonding said first and second surfaces;
immersing said first and second substrates in a first oxide etching solution before said creating step; and
immersing said first and second substrates in a second oxide etching solution after said creating step.

57. A method as recited in claim 56, comprising:
cleaning said first and second substrates before immersing said substrates in said first oxide etching solution.

58. A method as recited in claim 57, wherein said cleaning step comprises cleaning said first and second substrates in an RCA-1 solution.

59. A method as recited in claim 56, wherein each of said first and second substrates is substantially comprised of the same material.

60. A method as recited in claim 56, wherein said first and second substrates are substantially comprised of different materials.

61. A method as recited in claim 56, wherein said first and second substrates are substantially comprised of materials with different lattice constants.

62. A method as recited in claim 56, comprising:
forming a first layer on said first substrate; and
creating said surface defect region in said first layer.

63. A method as recited in claim 56, comprising:
forming a surface defect region in a first substrate including an active device.

64. A method as recited in claim 56, comprising:
bonding said first and second substrates at about room temperature.

65. A method for bonding first and second substrates, comprising:
preparing substantially oxide-free first and second surfaces of respective first and second substrates;
creating a surface defect region in each of said substantially oxide-free first and second surfaces;
bonding said first and second surfaces; and
forming at least one of boron-boron and Si covalent bonds between said first and second substrates at about room temperature.

66. A method as recited in claim 65, wherein each of said first and second substrates is substantially comprised of the same material.

67. A method as recited in claim 65, wherein said first and second substrates are substantially comprised of different materials.

68. A method as recited in claim 65, wherein said first and second substrates are substantially comprised of materials with different lattice constants.

69. A method as recited in claim 65, comprising:
forming a first layer on said first substrate; and
creating said surface defect region in said first layer.

70. A method as recited in claim 65, comprising:
forming a surface defect region in a first substrate including an active device.

71. A method as recited in claim 65, comprising:
bonding said first and second substrates at about room temperature.

72. A bonding method, comprising:
forming one of an amorphized and nearly-amorphized first region in a substantial portion of a first substantially oxide-free surface of a first substrate, said region containing one of boron and arsenic;
forming one of an amorphized and nearly-amorphized second region in a substantial portion of a second surface of a second substrate, said region containing one of boron and arsenic; and
bonding said first surface to said second surface to form a bonded pair of substrates.

73. A method as recited in claim 72, comprising:
forming each of said first and second regions to extend only one to a few monolayers into said first second substrates, respectively.

74. A method as recited in claim 72, wherein:
forming each of said first and second regions to a depth in a range of about a few nm.

75. A method as recited in claim 72, wherein:
forming at least one of said first and second regions by exposing said first and second surfaces to a plasma.

76. A method as recited in claim 72, wherein:
forming at least one of said first and second regions using ion implantation.

77. A method as recited in claim 72, wherein each of said first and second substrates are comprised of the same material.

78. A method as recited in claim 72, wherein said first and second substrates are comprised of different materials.

79. A method as recited in claim 72, wherein said first and second substrates are comprised of materials with different lattice constants.

80. A method as recited in claim 72, comprising:
forming a first layer on said first substrate; and
creating said first region in said first layer.

81. A method as recited in claim 72, comprising:
forming said first region in a first substrate including an active device.

82. A method as recited in claim 72, comprising:
bonding said first and second substrates at about room temperature.

83. A method as recited in claim 72, comprising:
implanting a boron-containing ion at a dose of about $5 \times 10^{14}$ cm$^{-2}$.

84. A method as recited in claim 72, comprising:
forming a layer of a desired thickness on said first substrate;
ion implanting said first surface through said layer to create said first region in said first substrate; and
creating said second region using one of ion implantation and plasma treatment.

85. A method as recited in claim 72, comprising:
creating said first region using said boron implantation; and
creating said second region using one of ion implantation and plasma treatment.

86. A method as recited in claim 72, comprising:
creating a surface defect region in an exposed surface of said bonded pair of substrates and in a third surface of a third substrate; and
bonding said third surface to said exposed surface.

87. A bonding method, comprising:
introducing a species into a substantially oxide-free first surface of a first substrate;
subjecting said first substrate to a process which terminates said species with hydrogen on a surface of said first substrate;
bringing said first surface into direct contact with a second substantially oxide-free second surface of a second substrate; and
bonding said first surface to said second substrate.

88. A method as recited in claim 87, comprising:
removing hydrogen from said species.

89. A method as recited in claim 88, comprising:
forming bonds between said species and constituent elements in said first substrate.

90. A method as recited in claim 87, wherein said species comprises boron and said first substrate comprises a silicon substrate, said method comprising:
forming one of boron-boron and silicon-boron bonds.

91. A method as recited in claim 87, comprising:
exposing said first surface to a boron-containing plasma.

92. A method as recited in claim 91, comprising:
exposing said first surface to a $B_2H_6$ plasma.

93. A method as recited in claim 87, comprising:
implanting a boron-containing ion into said first substrate.

94. A method as recited in claim 87, comprising:
creating a surface defect region in said substantially oxide-free second surface.

* * * * *

UNITED STATES PATENT AND TRADEMARK OFFICE
CERTIFICATE OF CORRECTION

PATENT NO.       : 7,332,410 B2                                    Page 1 of 1
APPLICATION NO.  : 10/358141
DATED            : February 19, 2008
INVENTOR(S)      : Qin-Yi Tong It is certified that error appears in the above-identified patent and that said Letters Patent is hereby corrected as shown below:

Column 13, line 57 claim 42, change "subs ate" to --substrate--.

Signed and Sealed this

Fourth Day of November, 2008

JON W. DUDAS
*Director of the United States Patent and Trademark Office*